US012289555B2

United States Patent
Segovia de la Torre et al.

(10) Patent No.: US 12,289,555 B2
(45) Date of Patent: Apr. 29, 2025

(54) ANALOGUE TO DIGITAL CONVERTER FOR IMAGE SENSOR READOUT

(71) Applicant: Teledyne Innovaciones Microelectrónicas, SLU, Seville (ES)

(72) Inventors: Jose Angel Segovia de la Torre, Seville (ES); Ana Gonzalez Marquez, Seville (ES); Rafael Dominguez Castro, Seville (ES); Alexander Charlet, Seville (ES); Alberto Villegas, Seville (ES)

(73) Assignee: Teledyne Innovaciones Microelectrónicas, SLU, Seville (ES)

( * ) Notice: Subject to any disclaimer, the term of this patent is extended or adjusted under 35 U.S.C. 154(b) by 268 days.

(21) Appl. No.: 17/980,046

(22) Filed: Nov. 3, 2022

(65) Prior Publication Data
US 2023/0134892 A1 May 4, 2023

(30) Foreign Application Priority Data

Nov. 3, 2021 (EP) .................................... 21206179

(51) Int. Cl.
| | | |
|---|---|---|
| *H04N 25/78* | (2023.01) | |
| *H03M 1/46* | (2006.01) | |
| *H03M 3/00* | (2006.01) | |
| *H04N 25/51* | (2023.01) | |
| *H04N 25/57* | (2023.01) | |
| *H04N 25/77* | (2023.01) | |
| *H04N 25/616* | (2023.01) | |

(52) U.S. Cl.
CPC .............. *H04N 25/78* (2023.01); *H03M 1/46* (2013.01); *H04N 25/51* (2023.01); *H04N 25/57* (2023.01); *H04N 25/77* (2023.01); *H03M 3/342* (2013.01); *H04N 25/616* (2023.01)

(58) Field of Classification Search
CPC ..... H03M 3/342; H04N 25/59; H04N 25/616; H04N 25/77; H04N 25/78
USPC ........................................................ 348/207.99
See application file for complete search history.

(56) References Cited

U.S. PATENT DOCUMENTS

| | | | |
|---|---|---|---|
| 9,386,240 B1 | 7/2016 | Johansson et al. | |
| 10,432,879 B2 | 10/2019 | Chang et al. | |
| 11,418,734 B1 * | 8/2022 | Wang ...................... | H04N 25/60 |

(Continued)

FOREIGN PATENT DOCUMENTS

| | | | |
|---|---|---|---|
| EP | 2696506 A1 | 12/2014 | |
| WO | WO-2009138545 A1 * | 11/2009 | ............ H03M 3/342 |

OTHER PUBLICATIONS

Chae et al., "A 2.1Mpixel 120frame/s CMOS Image Sensor with Column-Parallel ADC Architecture," International Solid-state Circuits Conference, Feb. 10, 2010, 236-247, ISSCC 46(1), IEEE, San Francisco, CA, United States of America.

(Continued)

*Primary Examiner* — Anthony J Daniels
(74) *Attorney, Agent, or Firm* — Haynes and Boone, LLP

(57) ABSTRACT

An analogue to digital converter for converting the analogue output of a dual conversion gain pixel of an image sensor. The dual conversion gain pixel is operable to sequentially output a reset pixel value and a signal pixel value sequentially with both a first gain and a second gain different to the first gain. An image sensor comprising the analogue to digital converter, a system comprising the image sensor and a method are also described herein.

14 Claims, 8 Drawing Sheets

(56) References Cited

U.S. PATENT DOCUMENTS

| | | |
|---|---|---|
| 2005/0018061 A1 | 1/2005 | Choi |
| 2015/0201140 A1 | 7/2015 | Solhusvik et al. |
| 2015/0215553 A1* | 7/2015 | Medeiro Hidalgo ... H03M 3/46 |
| | | 341/118 |
| 2019/0149754 A1 | 5/2019 | Otaka |
| 2020/0162691 A1* | 5/2020 | Mori ................. H01L 27/14641 |
| 2020/0195870 A1* | 6/2020 | Shim ..................... H03M 1/183 |
| 2022/0060647 A1* | 2/2022 | Lee ........................ H04N 25/78 |

OTHER PUBLICATIONS

Chen et al.., "A 15-bit incremental sigma-delta ADC for CMOS image sensor," Selected Papers from Conferences of the Photoelectronic Technology Committee of the Chinese Society of Astronautics, Apr. 13, 2015, 8 pages, Proc. SPIE. 9522, SPIE, China.

Matsuura et al: "Development of an ASIC for multi-readout X-ray CCDs", Nuclear Science Symposium Conference Record, Oct. 1, 2007, 1073-1077, NSS '07. IEEE, San Francisco, CA, United States of America.

* cited by examiner

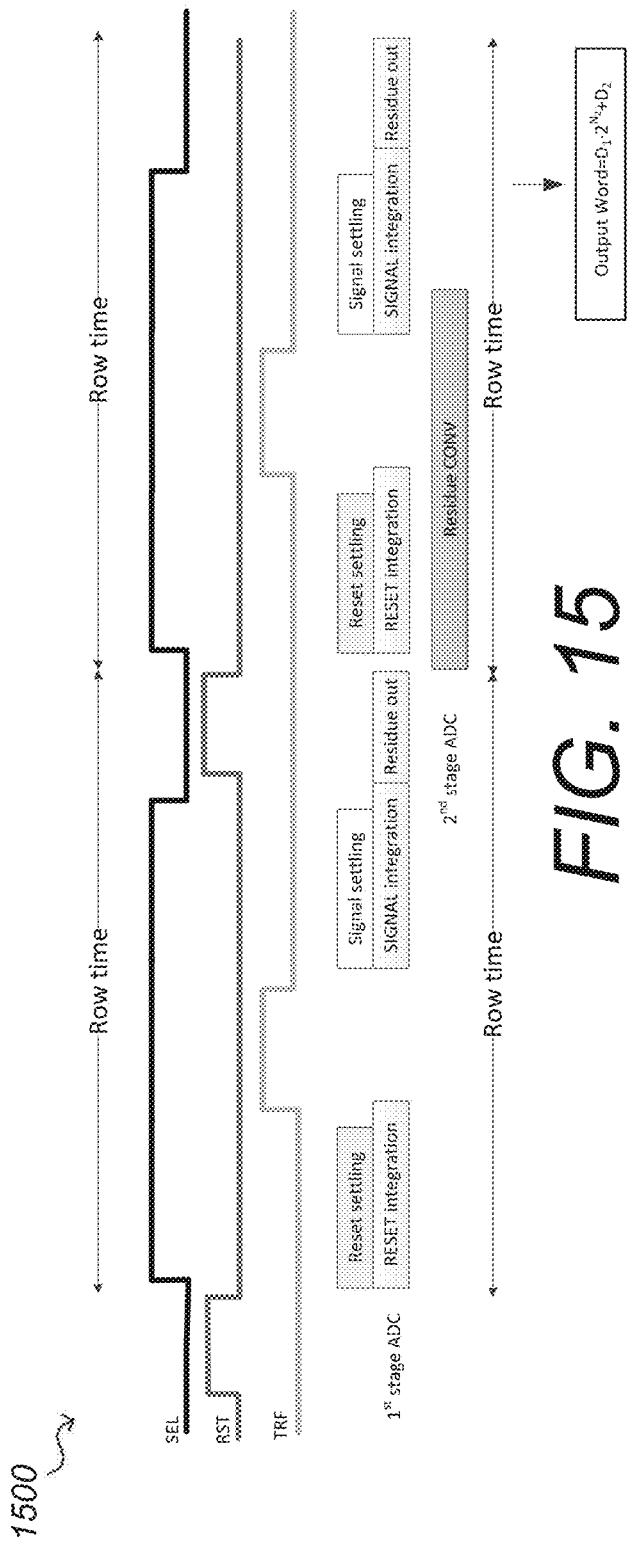

ANALOGUE TO DIGITAL CONVERTER FOR IMAGE SENSOR READOUT

CROSS REFERENCE TO RELATED APPLICATIONS

This application claims priority to European Patent Application No. EP21206179 filed Nov. 3, 2021 and entitled "ANALOGUE TO DIGITAL CONVERTER FOR IMAGE SENSOR READOUT," which is incorporated herein by reference in its entirety.

TECHNICAL FIELD

The present disclosure relates generally to analogue to digital converters. In particular, the present disclosure relates to analogue to digital converters for converting the analogue output of a pixel of an image sensor.

BACKGROUND

Analogue to digital converters (ADCs) form part of the underlying electronics in many electronic devices. In particular, image sensors rely on ADCs to convert the analogue signals output by the pixels of the image sensors into digital signals for producing a digitized version of the sensed image. Some applications, such as microscopy, astronomy and spectroscopy, require low noise and high dynamic range image sensors, and consequently the ADCs within the image sensors also need to have a low noise and high dynamic range.

Figure 1:
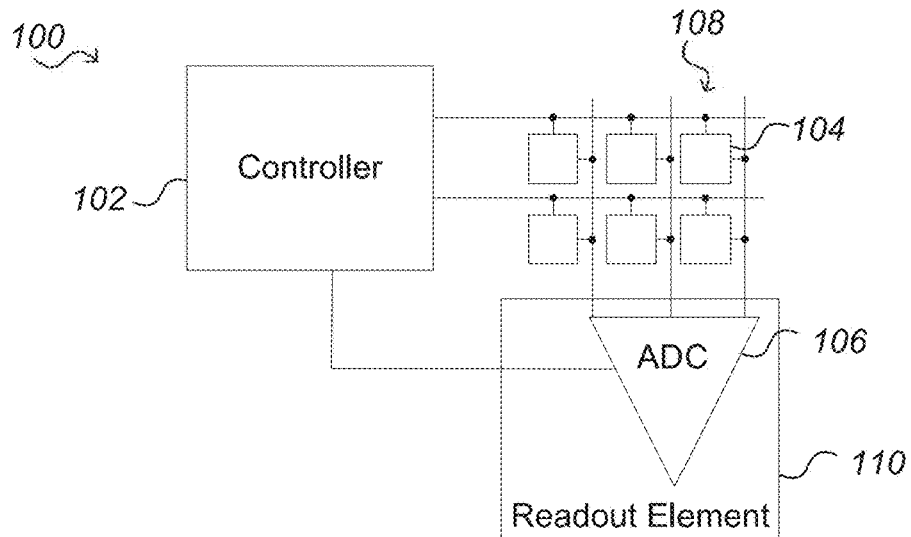

Image sensors typically comprise a pixel matrix and a readout element. FIG. 1 provides a schematic diagram of an image sensor 100 comprising a controller 102, a pixel matrix 108 and a readout element 110. As shown in FIG. 1, the pixel matrix 108 is an array of pixels 104 that are aligned in rows and columns. A controller 102 can sequentially enable each row or column of pixels 104, with the enabled pixels 104 being read out. In the image sensor 100 of FIG. 1, the controller 102 is connected to each row of pixels 104 and so may sequentially enable each row of pixels 104. In the image sensor 100 of FIG. 1, each column of pixels 104 is connected to the readout element 110 that comprises an ADC 106. When the controller 102 enables a particular row of pixels 104, a pixel 104 from each column sends an analogue measurement signal based on the photons incident on the pixel to the ADC 106 which receives the analogue signal from each pixel 104 and converts it into a digital signal. In an example, the output of each pixel 104 may be stored by the readout element 110 and sequentially input into the ADC 106. The controller 102 sequentially enables each row, effectively scanning the pixel matrix 108, so that the readout element 110 obtains digital signals for each of the pixels 104 to provide a signal that is representative of the photons incident on the pixel matrix 108 and, consequently, that is representative of the image being sensed.

In order to increase the sensitivity of the readout element 110 and reduce the noise contribution from the pixel, two samples may be taken from the pixel. The first sample is taken when the pixel is in a reset state, and so is not based on photons incident on the photodiode of the pixel. The second sample is taken when the charge collected by the photodiode of the pixel from incident photons has been transferred to the readout node. The first sample, which is a reference sample, can be subtracted from the second sample, as the measurement sample, to remove noise generated by the pixel. This is known as correlated double sampling (CDS). One way of subtracting the first sample from the second sample is to use the first and second samples as differential signals.

Figure 2:
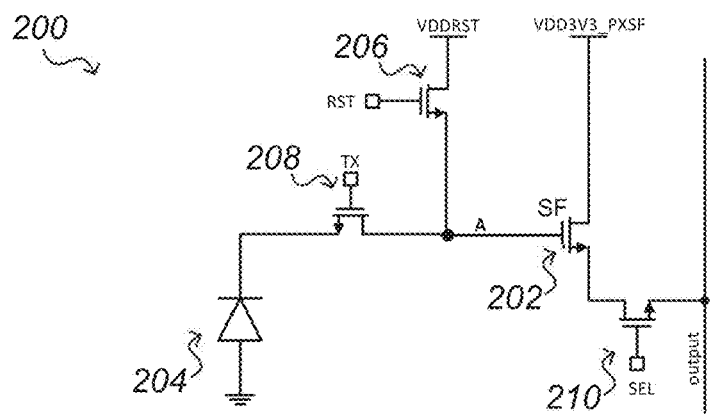

Example architecture of a pixel supporting CDS is illustrated in FIG. 2. The pixel 200 comprises a photodiode 204 to detect photons incident on the pixel. The pixel 200 further comprises four transistors having control signals labelled as transfer gate (TX) 208, reset (RST) 206 and row select (SEL) 210 and a transistor labelled as source follower (SF) 202. The transfer gate 208 controls the photodiode readout, making CDS readout possible. When the transfer gate 208 is off, the photodiode is not contributing to the output signal, which enables the noise from the rest of the circuit to be output from the pixel. This output, referred to throughout the specification as the reset pixel value, is used as a reference value. When the transfer gate 208 is on, the photodiode is contributing to the output signal, which is therefore based on the photons incident on the pixel. This output, referred to throughout the specification as the signal pixel value, provides the pixel measurement. The reset pixel value can be removed from the signal pixel value to reduce the noise contribution from the pixel. The noise contribution from the pixel includes thermal noise and low frequency noise, which varies per pixel, and such a variation, along with other sources of noise in the pixel, should be detected in order to separate it from the signal and to reduce distortion of the photodiode signal.

In order to readout the reset pixel value and signal pixel value from the pixel, the readout element 110 may also comprise a Correlated-Double Sampling (CDS) amplifier before the ADC 106, to compute the differential pixel signal and amplify it to the required level, and an output buffer, to bring the analogue signal out of the pixel matrix 108, where it is conditioned and digitized.

Whilst one readout element 110 is illustrated in FIG. 1, the time it would take for the ADC 106 and, optionally, the CDS amplifier to convert each pixel output would result in a large delay between detection and output and a very slow device. Thus, as the speed requirements of image sensors increase, the number of readout elements 110 may to be increased as well. Theoretically, the achievable frame rate of an image sensor linearly increases with the number of readout elements 110 working in parallel.

As a result of increased speed requirements, image sensors may comprise a readout element 110 per column of pixels, known as column-level readout parallelism, so that each readout element 110 processes the signal coming from pixels in a single column. Column-level readout parallelism can improve either speed or accuracy. For high speed applications, speed can be increased because the overall bandwidth can be enhanced. Alternatively, the increase in parallelism with the consequent relaxation of the individual ADC bandwidth allows improving the accuracy of each unit element for high resolution applications.

The ability to exchange accuracy and speed is intrinsic to all ADC topologies including integrating ADC topologies such as a single-ramp ADC, which is often used for image sensors with column-level readout parallelism because the content in circuitry per column is small, thus rendering it compatible with very low pixel pitch. In these ADCs, the number of clock cycles required to digitize with B-bit resolution is proportional to $2^B$. For example, a 10-bit resolution would require 1024 clock cycles to obtain a single digitized datum, while 4096 clock cycles are required to code 12 bits, which illustrates the theoretical accuracy-speed trade-off: solving one more bit amounts to doubling the conversion time. Thus, it is difficult to achieve a high speed and high accuracy analogue-to-digital conversion.

In order to achieve a high speed, high accuracy ADC, it may be desirable to reduce the noise generated by the pixel or the readout element. Where an ADC comprises a switched capacitor (SC) circuit, sampling noise can be reduced by increasing the value of the sampling capacitor. However, sampling noise root mean square (RMS) value scales by the square root of the capacitance, thereby requiring large capacitors to be compliant with the scaling up ADC resolution. This leads to inefficient per column implementations, both in power consumption and area occupation, especially for very low pixel pitch.

To address this issue, oversampled ADCs can be utilised. In these, oversampling is used to lower the equivalent sampling noise for the given capacitance. Moreover, noise feedback techniques can be applied to reduce the quantization noise of low-resolution quantizers. An example of an oversampled ADC that uses noise feedback techniques is a first-order sigma delta ADC, as illustrated as a schematic diagram in FIG. 3, which uses a comparator as a single-bit quantizer. The sigma delta ADC 300 is described in more detail below. The sigma delta ADC 300 does not require many components and is very efficient in terms of analogue content because, compared to a single-ramp ADC which comprises a comparator, it only requires one additional integrator. Furthermore, due to the sigma delta modulation, its operation is robust in the presence of circuit non-idealities and interferences, whose effects are attenuated by the number of times the input signal is sampled to get a single conversion, which is known as the oversampling ratio (OSR). The sampling noise for an oversampled case equals KT/(OSR·Cs), where Cs stands for the sampling capacitor value, K is the Boltzmann's constant and T is the temperature. This shows that OSR and capacitance are interchangeable in terms of reducing noise.

Whilst the ADC 300 reduces sampling noise through the use of a high OSR, in order for such a noise reduction to improve the speed and/or accuracy of the readout element 110, noise sources before the ADC must also be minimized, which is not always achieved. For example, the noise contribution from a CDS amplifier, as mentioned above, may mask the benefits of the sigma-delta topology of the ADC 300.

Thus, to further reduce the noise prior to the ADC, the CDS amplifier within the readout element 110 can be removed and instead, CDS can be performed by the ADC internally by performing two conversions for each pixel, one for the reset pixel value and one for the signal pixel value. The outputs of the ADC can then be subtracted digitally to obtain the difference between the signals. In combination with oversampled sigma-delta techniques, this kind of digital CDS brings two clear advantages. Firstly, sampling noise is determined by the product OSR·Cs rather than by the sampling capacitance itself. Secondly, the noise source preceding the ADC is also oversampled, with the subsequent attenuation by OSR.

As a drawback, in the CDS operation, the conversion noise is doubled in power and, as the ADC has to perform conversion twice for each pixel, this doubles the conversion time, increases the power and requires digital data storage and subtraction.

It is an object of embodiments of the invention to at least mitigate one or more of the problems of the prior art.

SUMMARY

The inventors have come to the surprising realisation that a CDS amplifier can be removed from the readout circuit, in order to reduce the noise, without significantly decreasing the speed or accuracy of the image sensor. The inventors have devised an ADC with an embedded analogue CDS that does not require a preceding CDS amplifier. The ADC also reduces the space required for each readout element 110.

However, as described in more detail below, in order to cover a high dynamic range, a pixel has been developed that is operable in two different modes: a low gain mode and a high gain mode. Such a pixel is known as a dual conversion gain (DCG) pixel and outputs signals in a specific sequence. The inventors have therefore devised an analogue to digital converter with an embedded analogue CDS that can sequentially sample signals with a low gain and a high gain, in order to operate with a dual conversion gain pixel and consequently provide a high dynamic range.

Thus, according to an aspect of the invention, there is provided an analogue to digital converter for converting the analogue output of a dual conversion gain pixel of an image sensor. The dual conversion gain pixel is operable to sequentially output a reset pixel value and a signal pixel value sequentially with both a first gain and a second gain different to the first gain. The analogue to digital converter comprises analogue storage for storing the reset pixel value output with the first gain. The analogue to digital converter further comprises a converter stage arranged to sequentially sample a first analogue input indicative of a reset pixel value of the dual conversion gain pixel and a second analogue input indicative of a signal pixel value of the dual conversion gain pixel. The converter stage is configured to sequentially sample the first input and the second input and output a digital value indicative of a difference between the first input and the second input. The analogue to digital converter further comprises circuitry configured to sequentially provide the reset pixel value output with the second gain as a first input to the converter stage and the signal pixel value output with the second gain as a second input to the converter stage such that the converter stage sequentially samples the first and second inputs and outputs a first digital value indicative of a difference between the reset pixel value output with the second gain and the signal pixel value output with the second gain. The circuitry is further configured to provide the reset pixel value output with the first gain and stored in the analogue storage as a first input to the converter stage and the signal pixel value output with the first gain as a second input to the converter stage. The converter stage is configured to sample the first and second inputs and output a differential signal indicative of a difference between the reset pixel value output with the first gain and the signal pixel value output with the first gain.

The ADC described above incorporates CDS operation by the converter stage being arranged to sequentially sample a reset pixel value and a signal pixel value and output a digital value indicative of a difference between the reset pixel value and the signal pixel value and by the circuitry providing such inputs to the converter. The ADC is operable with a DCG pixel because it can store the first gain reset pixel value in the analogue storage such that CDS can be performed separately on the low gain and high gain signal, as explained in more detail below. Therefore, the ADC described above performs oversampling (at least for the second gain), is operable with a DCG pixel and incorporates CDS operation and direct conversion without the need for any CDS amplifier or sample and hold block. This combination of features in the ADC provide an ADC with a low noise, a high dynamic range and a high accuracy without compromising on speed.

For high gain operation, the converter stage may sequentially sample a reset pixel value and a signal pixel value and output a digital value indicative of a difference between the reset pixel value and the signal pixel value. This sampling may be performed over a number of clock cycles, and thus these values may be oversampled. However, for the low gain operation, the converter stage may sample the reset pixel value from the storage and the signal pixel value at the same time to output a differential signal to, for example, a second converter stage. Thus, for the low gain operation, the converter stage may operate in an analogous way to a CDS amplifier. Whilst oversampling is advantageous for the high gain signal due to its high noise contribution, due to the noise contribution of the low gain signal being generally lower than shot noise, and lower than that of the high gain signal, the benefit of oversampling for the low gain signal is reduced. Moreover, due to the storage of the first gain reset pixel value, this value may only be sampleable once. Therefore in order to speed up the operation of the ADC and in order to effectively utilise the storage, the low gain signal may not be oversampled but may only be sampled once and may output a differential signal rather than a digital signal. The combined use of the converter stage for high gain conversion and low gain conversion reduces the size of the ADC and the power consumed by the ADC.

As the ADC does not require a sample and hold block and incorporates CDS operation, it allows multiple sampling of the pixel in the analogue domain, without the need for storing the samples in the analogue domain or the digital domain. Moreover, the removal of the separate CDS amplifier and sample and hold block also reduces the noise generated before the ADC, in addition to reducing the area and speed of the image sensor. A CDS amplifier does not allow applying oversampling to the pixel whilst the integrated CDS allows analogue multisampling of the pixel signal which also reduces the pixel noise. The ADC is based on sigma delta topology and thus enables oversampling that reduces the noise power by a factor OSR. Moreover, by using direct conversion plus a sigma delta approach, the ADC is able to average the noise coming from the pixel.

The ADC is operable with a DCG pixel to perform conversion of the pixel signal at both the first gain and the second gain, optimizing trade-off between noise and resolution versus power consumption and area and providing a high dynamic range. In particular, the dual conversion gain feature allows the invention to extend the dynamic range.

The analogue to digital converter for converting the analogue output of a dual conversion gain pixel of an image sensor may convert the difference between the received first analogue input and second analogue input to a digital value.

The dual conversion gain pixel being operable to sequentially output a reset pixel value and a signal pixel value sequentially with both a first gain and a second gain different to the first gain may be understood to mean that the dual conversion gain pixel is operable to sequentially output a reset pixel value with a first gain and a second gain and, subsequently, sequentially output a signal pixel value with a second gain and a first gain. The converter stage may be arranged to sequentially receive a reset pixel value and signal pixel value to perform internal CDS to find the difference between the signal and reset pixel values. However, as disclosed above, the dual conversion gain pixel may not output the reset pixel value and the signal pixel value with the first gain consecutively but may separate these values by the second gain values (i.e. the reset and signal values output with the second gain). Therefore the circuitry may be configured to store the reset pixel value output with the first gain in the analogue storage such that the converter stage can sequentially receive the reset pixel value and signal pixel value of the second gain and then receive the reset pixel value with the first gain from storage before or whilst receiving the signal pixel value with the first gain from the pixel. As the converter stage can therefore sequentially receive the reset pixel value and signal pixel value of each gain, this enables internal CDS to be performed for both the first and second gain using the same ADC.

The circuitry may be further configured to operate the dual conversion gain pixel to sequentially output a reset pixel value and a signal pixel value sequentially with both a first gain and a second gain different to the first gain.

The analogue storage may be a capacitor.

The ADC may be a per-column ADC.

The circuitry may comprise switches controlled to open or close in order to sequentially provide the values output from the pixel as inputs to the converter stage and/or to control the operation of the converter stage. The circuitry may further comprise a controller to control whether the switches are closed or open.

The second gain may be greater than the first gain. The first gain may be understood to be the low gain and the second gain may be understood to be the high gain, as explained below. The terms first gain and low gain may be used interchangeably throughout this specification. The terms second gain and high gain may be used interchangeably throughout this specification.

Where the second gain is a high gain and the first gain is a low gain, if there are a small number of electrons in the photodiode, the digital value converted from the high gain signals is the more useful signal and, if there are a large number of electrons in the photodiode, the digital value converted from the low gain signals is the most useful signal, as explained further below. The converter enables the output of both digital values and operates with the pixel in the first and the second gain to sense a large range of electrons in the photodiode and so provides an image sensor with a high dynamic range.

The converter stage may comprise an integrator for integrating a voltage difference between the analogue input sampled by the converter stage and a feedback signal. The converter stage may further comprise a comparator for comparing the integrated voltage difference to a reference voltage. The feedback signal may be dependent on an output of the comparator.

The integrator may be a switched capacitor integrator.

The converter stage may further comprise a digital to analogue converter to convert the comparator output to an analogue signal. The feedback signal may be the analogue signal.

The converter stage may be based on or may comprise a sigma delta ADC. Using a sigma delta ADC or an ADC based on sigma delta architecture reduces the noise contribution of the ADC and averages the noise coming from the pixel. The sigma delta ADC may be an incremental sigma delta ADC. The sigma delta ADC may be a first order ADC or a second order ADC. A first order incremental ADC is advantageous for minimizing the circuitry content.

The digital value may be based on the output of the comparator.

The polarity of the feedback signal may be dependent on whether the analogue input received by the converter stage is the first input or the second input such that the digital value output by the converter stage may be indicative of the difference between the first input and the second input.

If the analogue input is the first input, the feedback signal may be positive, and if the analogue input is the second input, the feedback signal may be negative. The size of the feedback signal may also be dependent on whether the analogue input received by the converter stage is the first input or the second input. If the analogue input is the first input and the comparator output is high (logical 1), the feedback signal may be set to a second reference voltage. If the analogue input is the first input and the comparator output is low (logical 0), the feedback signal may be grounded. If the analogue input is the second input and the comparator output is high (logical 1), the feedback signal may be grounded. If the analogue input is the second input and the comparator output is low (logical 0), the feedback signal may be set to a negative second reference voltage.

The circuitry may be configured to control the digital to analogue converter based on the analogue input, for example, to output a feedback signal configured as above. Additionally or alternatively, the converter stage may comprise circuitry to control the digital to analogue converter based on the analogue input.

The circuitry may be configured to provide the reset pixel value output with the second gain as a first input to the converter stage over a plurality of clock cycles of the converter stage such that the converter stage samples the first input a plurality of times to provide a plurality of outputs at the comparator for the first input. The circuitry may be further configured to provide the signal pixel value output with the second gain as a second input to the converter stage over a plurality of clock cycles of the converter stage such that the converter stage samples the second input a plurality of times to provide a plurality of outputs at the comparator for the second input.

An iteration may occur at each clock cycle. During an iteration, the components of the converter stage may be executed such that they perform their intended operation. A conversion may comprise any number of iterations and so any number of clock cycles may be used to perform a conversion. By providing the first and second inputs to the converter stage over a plurality of clock cycles, the inputs are effectively oversampled. Oversampling reduces the noise contribution of the ADC. Moreover, the more clock cycles used to obtain the conversion, the more accurate the analogue to digital conversion.

The circuitry may be configured to provide the reset pixel value output with the first gain and stored in the analogue storage as a first input to the converter stage and the signal pixel value output with the first gain as a second input to the converter stage over one clock cycle of the converter stage such that the converter stage samples the first and second inputs once to provide the differential signal at the integrator.

The analogue to digital converter is optimised to be compatible with a DCG pixel to perform conversion of the pixel signal in both low gain and high gain. In particular, the dual conversion gain feature allows the invention to extend the dynamic range. However, having to convert in both low gain and high gain increases the time taken for each conversion and so reduces the speed of the ADC. Therefore, where the first gain is the low gain, the ADC may use less time to process the inputs for the low gain by only using one clock cycle, meaning the components of the converter stage operate on and propagate the input signal through the converter stage once and without feeding back any signal. The signal pixel value and reset pixel value therefore propagate in one clock cycle through the integrator with the resultant differential signal output from the integrator. This low gain conversion is lower precision and the inputs are not oversampled so noise is not reduced by oversampling. However, a high precision conversion may not be required for the low gain due to the high intrinsic noise linked to the photon signal, known as the shot noise. Thus, by only converting the first gain components over one clock cycle, the conversion time is reduced, increasing the ADC speed, without compromising on the accuracy of such a conversion.

Each output at the comparator may comprise a digital signal, the digital value being based on the digital signals. The digital signals may be stored in digital storage, such as a counter. The digital value may be the accumulation of digital signals. Alternatively, the digital value may be based on the number of 1's in the accumulation of digital signals. Alternatively, the digital value may be based on the percentage of 1's in the accumulation of digital signals.

The converter may further comprise a second converter stage. The circuitry may be further configured to provide the differential signal to the second converter stage. The second converter stage may be configured to sample the differential signal and output a first gain digital value indicative of the difference between the reset pixel value output with the first gain and the signal pixel value output with the first gain. The differential signal may be output by the integrator of the converter stage.

The second converter stage may be configured to output the first gain digital value based on the comparison of the differential signal to a variable reference voltage.

Using a second converter stage enables the differential signal to be converted to a digital signal, which removes reliance on the first converter stage to convert the signals of the first gain to a digital signal and so enables an increase in the speed of the first converter stage and effective utilisation of the storage. As explained in more detail below, the second converter stage can work in parallel with the first converter stage such that when the first converter stage is converting the next pixel the second converter stage can finish converting the previous pixel. Thus, the combination of the first and second converter stages provide an ADC with a low noise, a high dynamic range and a high accuracy without compromising on speed.

The circuitry may be further configured to provide an analogue residue to the second converter stage after it has sequentially provided the reset pixel value output with the second gain as the first input to the converter stage and the signal pixel value output with the second gain as the second input to the converter stage. The second converter stage may be configured to sample the analogue residue and output a second digital value indicative of the analogue residue.

The analogue residue may be the signal accumulated by the integrator of the converter stage when the converter stage has finished conversion of the reset and signal pixel values of the second gain to the first digital value. The analogue residue may be output by the integrator of the converter stage.

Using a second converter stage enables the residue to be converted without further iterations of the converter stage being required, so the accuracy of the ADC can be increased without reducing the speed.

The two converter stages may provide a pipelined architecture, so that after the analogue residue or differential signal is sampled by the second converter stage and whilst the second converter stage is converting the analogue residue or differential signal, the first converter stage can be concurrently sampling the next inputs from the dual conversion gain pixel. This reduces the time taken to convert all pixel outputs without reducing the accuracy. This overcomes the limit of speed in pure integrating sigma delta ADCs, where the conversion time grows with the number of integrations. Moreover, no sample and hold is needed in order to proceed with the conversion and the first stage ADC can still perform pixel noise reduction when performing oversampling. Thus, using the pipeline architecture allows the first and second converter stage to operate in parallel such that the ADC maintains its high speed despite being optimized to have low noise and high dynamic range.

The second converter stage may be configured to output the second digital value based on the comparison of the sampled analogue residue to a variable reference voltage.

The second converter stage may comprise a single ramp ADC. Using such an ADC as the second stage is advantageous as it comprises a small amount of circuitry. This may allow multiple ADCs to be used within an image sensor without a large increase in the size or circuitry content of the sensor.

The variable reference voltage may increase over time. The second converter stage may further comprise a comparator to compare the sampled analogue residue or differential signal to the variable reference voltage and a counter, the digital value being based on the counter value when the comparator output changes.

The converter stage and second converter stage can also form a pipeline architecture for each gain so the second gain outputs can be converted by the second converter stage whilst the first gain outputs are converted by the converter stage. In detail, after the converter stage has converted the reset pixel value and signal pixel value of the second gain, the residue of this conversion may be converted by the second converter stage whilst the converter stage converts the reset pixel value and signal pixel value of the first gain. Then, after the converter stage has converted the reset pixel value and signal pixel value of the first gain, the differential signal from this conversion may be converted by the second converter stage whilst the converter stage converts the next pixel inputs of the second gain.

The analogue to digital converter may be configured to determine a second gain digital value indicative of the difference between the reset pixel value output with the second gain and the signal pixel value output with the second gain. The second gain digital value may be dependent on the first and second digital values.

The first digital value and second digital value may be combined to form the second gain digital value. For example, the first digital value and second digital value may be concatenated to form the second gain digital value. The first digital value may provide the most significant bits of the second gain digital value and the second digital value may provide the least significant bits of the second gain digital value. Whilst the second gain digital value may comprise outputs from both the converter stage and the second converter stage, the first gain digital value may comprise only an output from the second converter stage. Thus the second gain digital value may comprise more bits than the first gain digital value. Thus, the second gain digital value may have a larger range or a higher sensitivity than the first gain digital value.

The circuitry may be further configured to select one of the first gain digital value and the second gain digital value to output from the converter. Where the second gain is greater than the first gain, if there are a small number of electrons in the photodiode, the second gain digital value is the more useful signal and, if there are a large number of electrons in the photodiode, the first gain digital value is the most useful signal. The circuitry may therefore be configured to select the most useful digital value of the first and second gain digital values based on the above.

According to another aspect of the invention, there is provided an image sensor comprising an array of dual conversion gain pixels and at least one analogue to digital converter described herein.

The image sensor may comprise an analogue to digital converter for each column of the array of pixels. This enables the conversion of each pixel in a row simultaneously to provide an image sensor having an increased speed.

The image sensor may be a complementary metal oxide semiconductor (CMOS) image sensor.

According to another aspect of the invention, there is provided a system for sensing an image, the system comprising an image sensor as described above and a controller. The controller is configured to select one or more pixels of the image sensor to be sensed. The controller is further configured to control the operation of the one or more pixels to sequentially output a reset pixel value and a signal pixel value sequentially with both the first gain and the second gain different to the first gain. The controller is further configured to control the circuitry of the at least one converter of the image sensor based on the operation of the one or more pixels to convert the analogue output of each of the one or more pixels to a digital value.

According to another aspect of the invention, there is provided a method of an analogue to digital converter for converting the analogue output of a dual conversion gain pixel of an image sensor, wherein the dual conversion gain pixel is operable to sequentially output a reset pixel value and a signal pixel value sequentially with both a first gain and a second gain different to the first gain. The method comprises storing, in analogue storage, the reset pixel value output with the first gain. The method further comprises sequentially sampling, at a converter stage, the reset pixel value output with the second gain as a first analogue input and the signal pixel value output with the second gain as a second analogue input. The method further comprises sequentially sampling, at the converter stage, the first and second inputs and outputting a first digital value indicative of a difference between the reset pixel value output with the second gain and the signal pixel value output with the second gain. The method further comprises sampling, at the converter stage, the reset pixel value output with the first gain and stored in the analogue storage as a first input and the signal pixel value output with the first gain as a second input. The method further comprises sampling, at the converter stage, the first and second inputs and outputting a differential signal indicative of a difference between the reset pixel value output with the first gain and the signal pixel value output with the first gain.

Many modifications and other embodiments of the inventions set out herein will come to mind to a person skilled in the art to which these inventions pertain in light of the teachings presented herein. Therefore, it will be understood that the disclosure herein is not to be limited to the specific embodiments disclosed herein. Moreover, although the description provided herein provides example embodiments in the context of certain combinations of elements, steps and/or functions may be provided by alternative embodiments without departing from the scope of the invention.

BRIEF INTRODUCTION OF THE DRAWINGS

Figure 3:
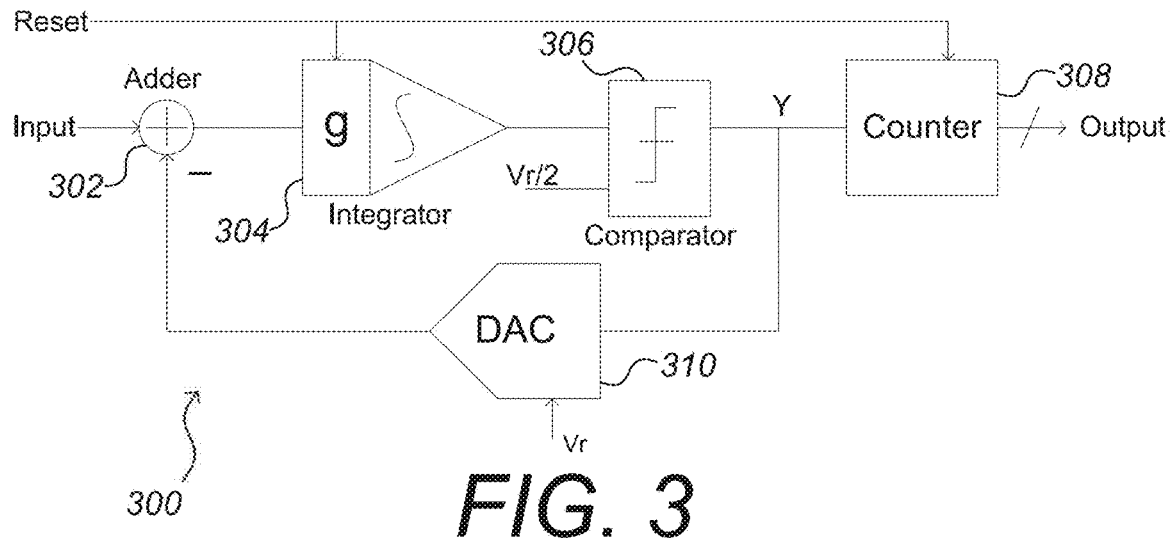
Figure 4:
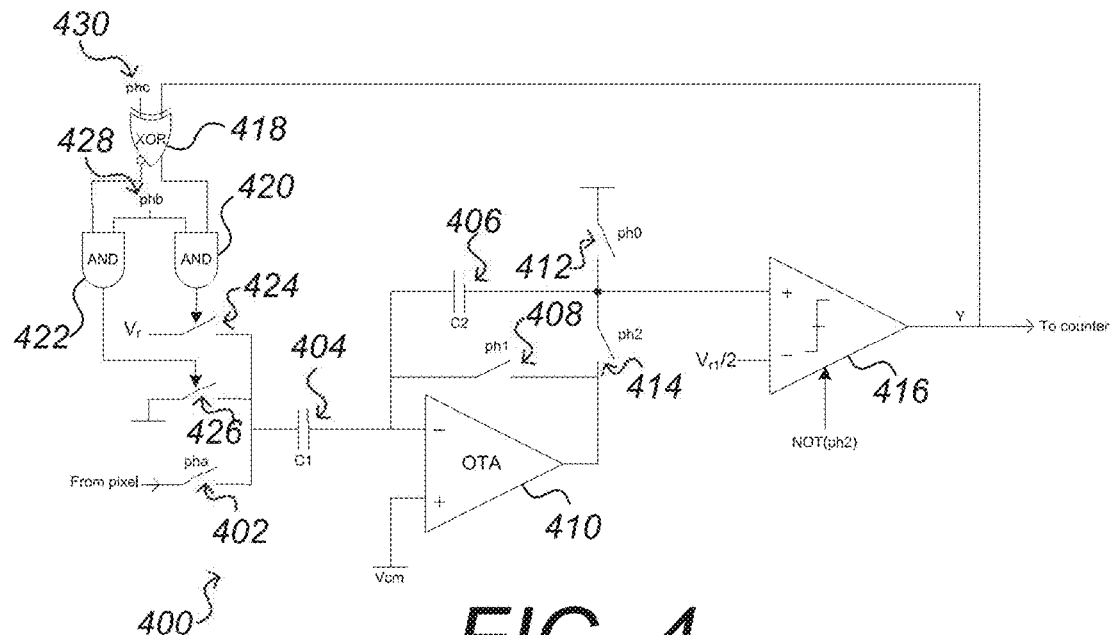
Figure 5:
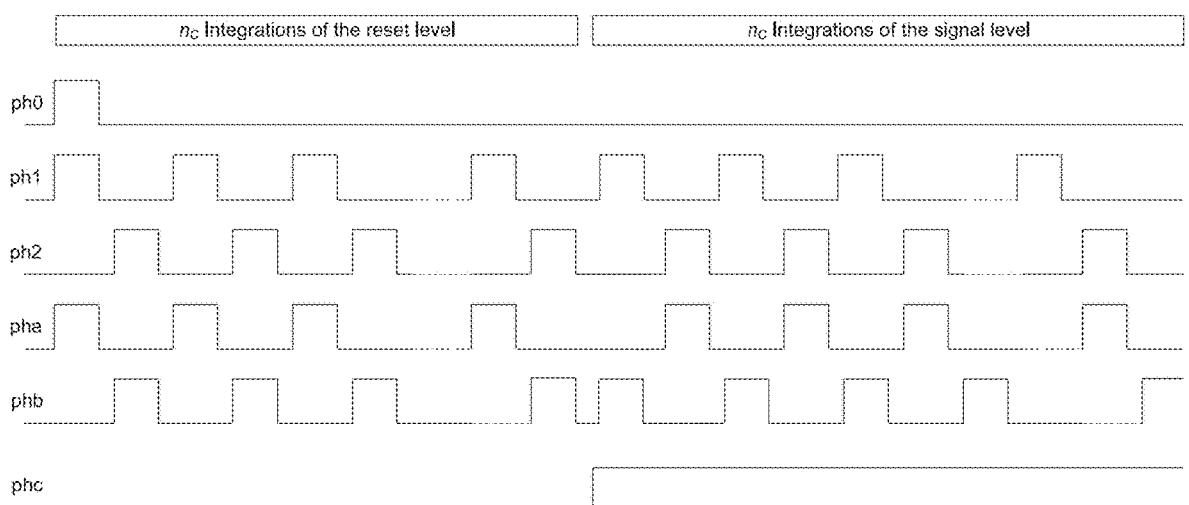
Figure 6:
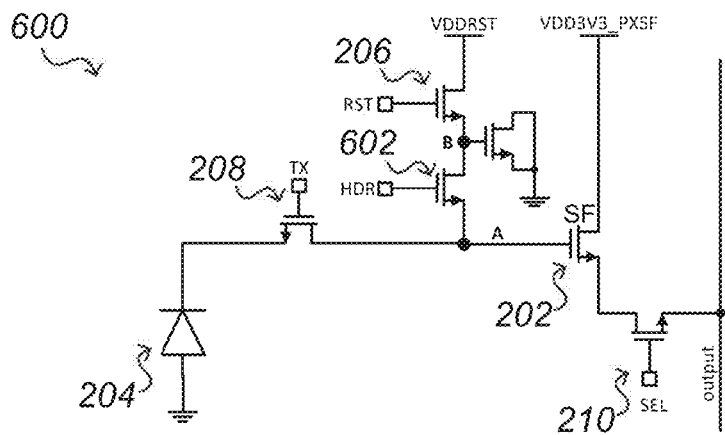
Figure 7:
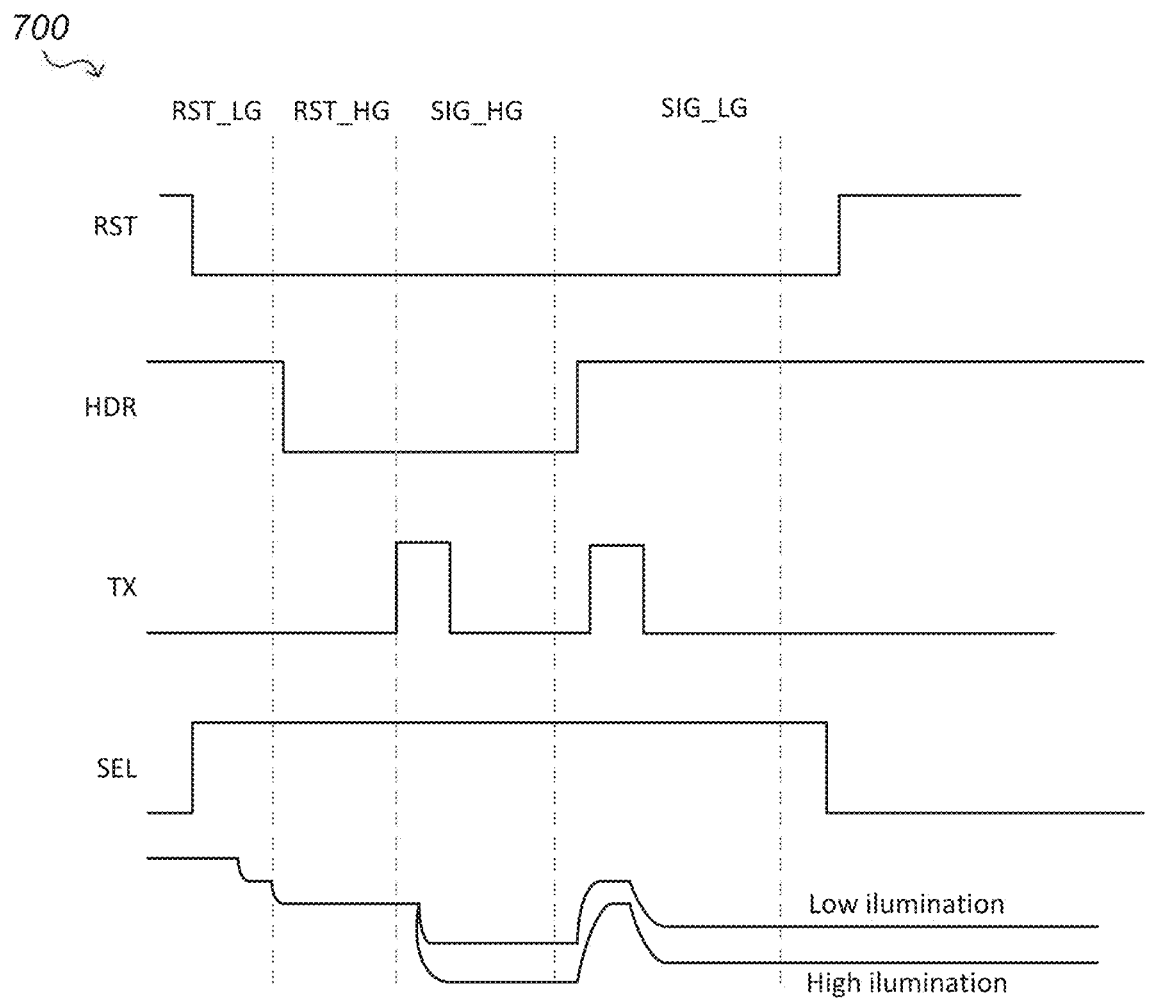
Figure 8:
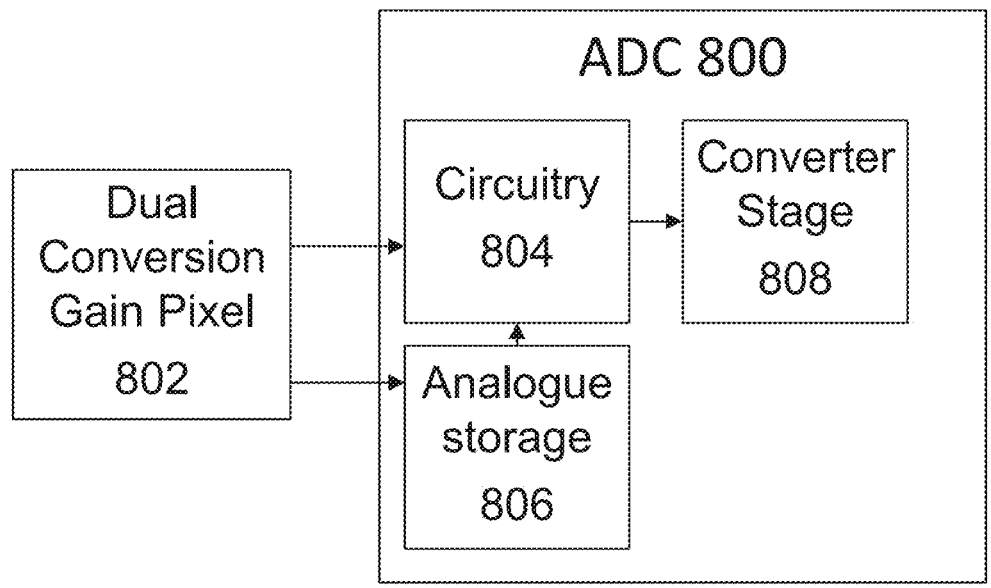
Figure 9:
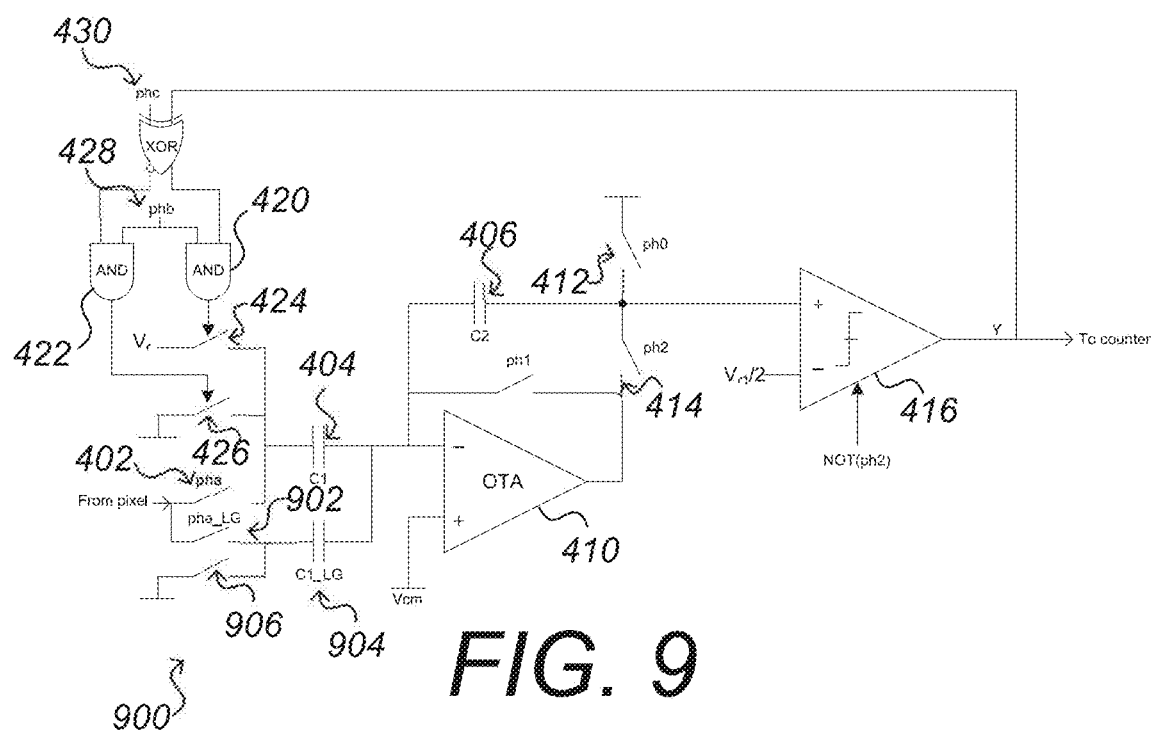
Figure 10:
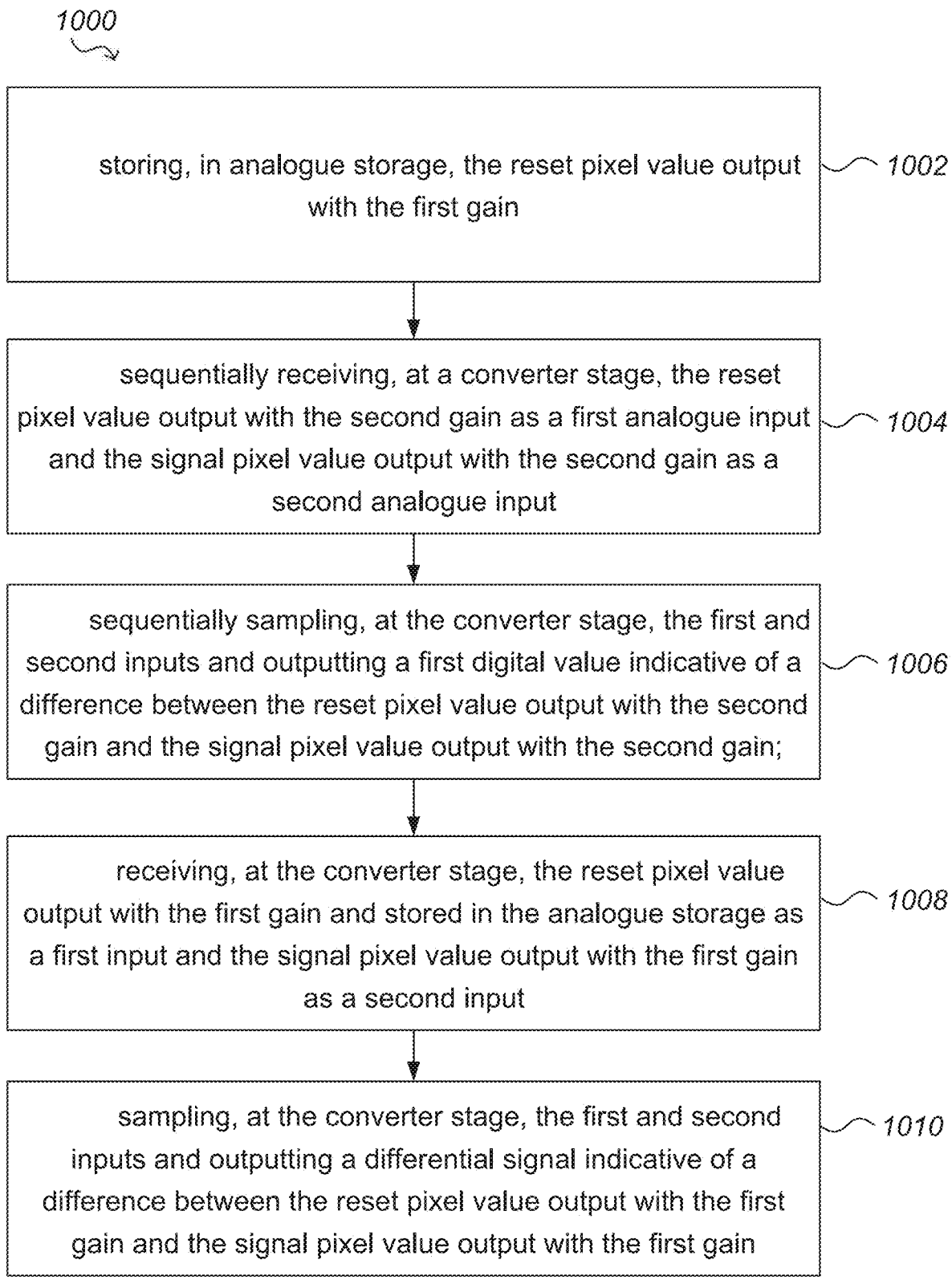
Figure 11:
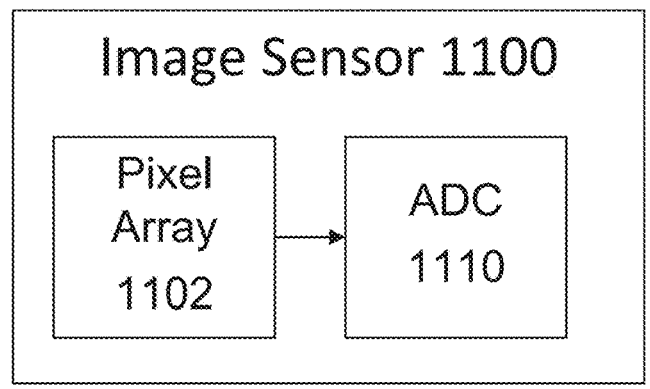
Figure 12:
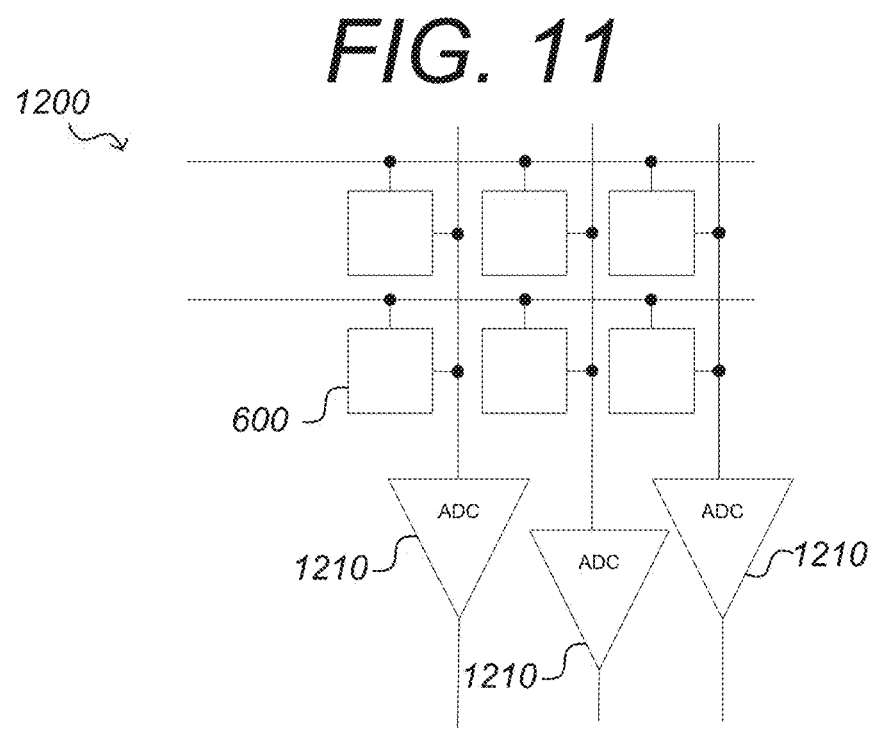
Figure 13:
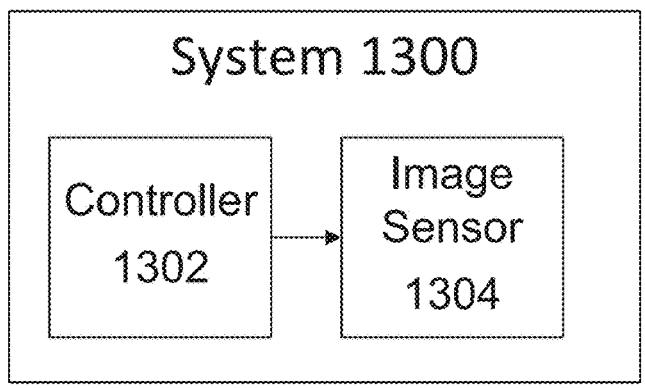
Figure 14:
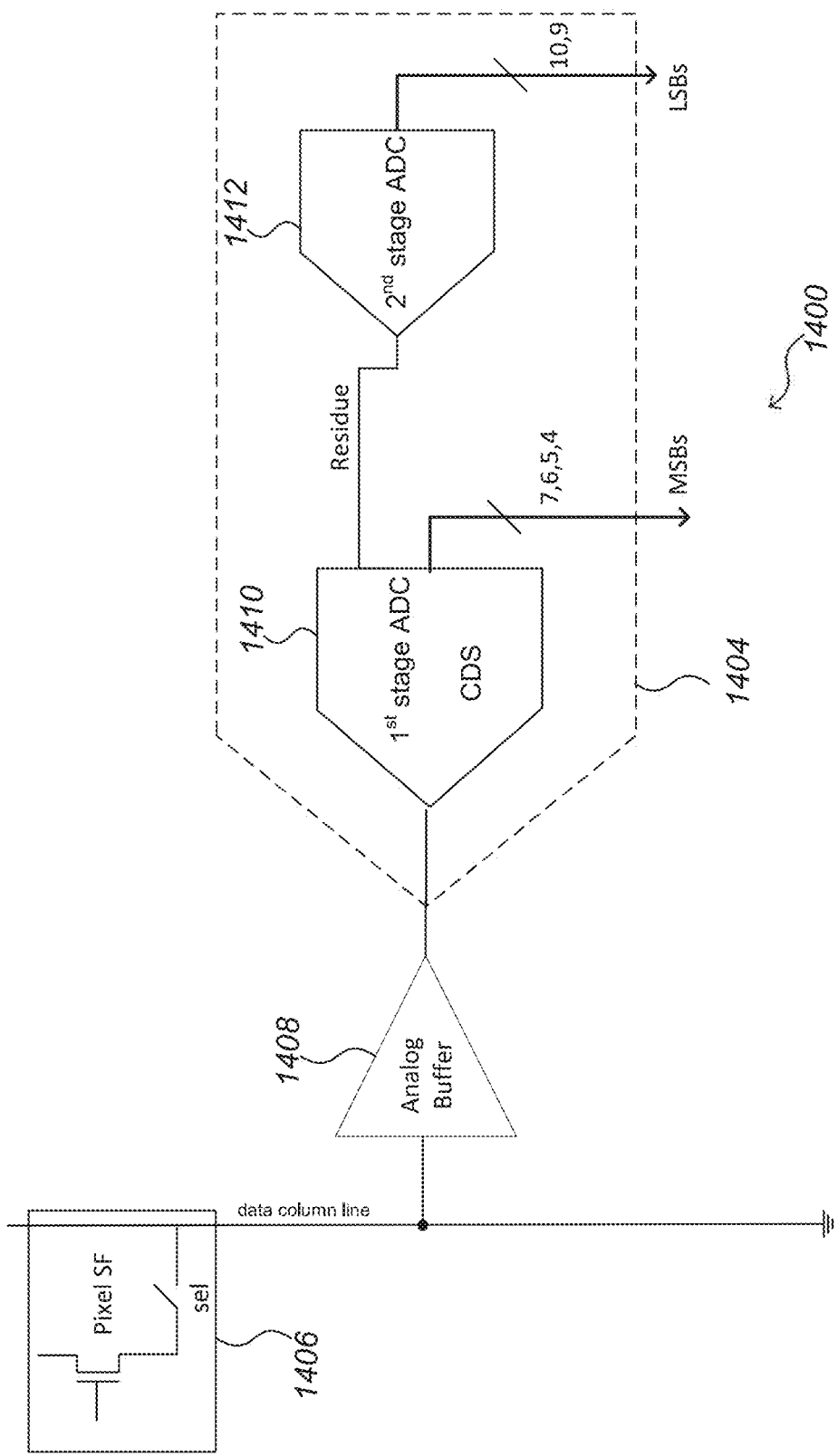

Illustrative embodiments of the invention will now be described, by way of example only, with reference to the accompanying drawings, in which:

FIG. 1 provides a schematic diagram of an image sensor;

FIG. 2 provides a circuit diagram of a pixel;

FIG. 3 provides a schematic diagram of an ADC;

FIG. 4 provides a circuit diagram of an ADC according to an example;

FIG. 5 provides an example timing diagram of the ADC of FIG. 4;

FIG. 6 provides a circuit diagram of a Dual Conversion Gain pixel;

FIG. 7 provides an example timing diagram of the pixel of FIG. 6;

FIG. 8 provides a schematic diagram of an ADC according to an example;

FIG. 9 provides a circuit diagram of an ADC according to an example;

FIG. 10 provides an example flowchart of a method according to an example;

FIG. 11 provides a schematic diagram of an image sensor according to an example;

FIG. 12 provides a schematic diagram of an image sensor according to an example;

FIG. 13 provides a schematic diagram of a system for sensing an image according to an example;

FIG. 14 provides a schematic diagram of an image sensor according to an example;

FIG. 15 provides an example timing diagram of the image sensor of FIG. 14; and

FIG. 16 provides a schematic diagram of an ADC.

Throughout the description and the drawings, like reference numerals refer to like parts.

DETAILED DESCRIPTION

The present disclosure provides many examples of analogue to digital converters and image sensors comprising analogue to digital converters. While various embodiments of the invention are described below, the invention is not limited to these embodiments, and variations may be made to the examples provided herein without departing from the scope of the invention.

As was mentioned above, FIG. 3 provides a schematic diagram of a sigma delta ADC for converting an analogue input signal to a digital value. The sigma delta ADC 300 of FIG. 3 is an example of a first-order incremental ADC. The sigma delta ADC 300 comprises an adder 302, an integrator 304, a comparator 306, a counter 308 and a digital to analogue converter (DAC) 310. Whilst a clock and its connections are not shown in FIG. 3, they may form part of the ADC 300. A conversion by the ADC of an analogue input signal to a digital value may be performed over any number of clock cycles, also known as iterations. Every clock cycle, the components of the ADC may be executed and perform their function as set out below. The analogue input may be an analogue input signal from a pixel. An input signal from a pixel may be sampled during each clock cycle such that the number of times the input signal is sampled for a single conversion is dependent on the number of clock cycles over which the conversion is performed.

Every clock cycle, the adder 302 is to subtract a feedback signal from an analogue input signal received from a pixel to provide a voltage difference to the integrator 304. The adder 302 illustrated in FIG. 3 represents any circuitry that can provide the difference, for example a potential difference, between the input signal and the feedback signal to the integrator 304. The integrator 304 has a gain g and is for integrating the voltage difference provided by the adder 302. In each clock cycle, the integrator 304 accumulates the difference between the input signal and the feedback signal. For example, the integrator 304 may effectively add the voltage difference to the signal already present in the integrator. The comparator 306 is connected to the integrator and, in each clock cycle, compares the integrated signal to a reference voltage Vr/2. The comparator 306 outputs a digital signal in response to the comparison. For example, if the voltage of the signal output by the integrator is higher than Vr/2, the comparator output may be high (logical 1) and if the voltage of the signal output by the integrator is lower than Vr/2, the comparator output may be low (logical 0). During each conversion, the outputs of the comparator (logic 0 or logic 1) are accumulated digitally in the counter 308. The accumulated outputs in the counter 308 form the digital value to be output from the ADC 300.

The output from the comparator 308 is also fed back to the adder 302 via the DAC 310, which converts the digital output from the comparator 308 to a feedback signal having an analogue voltage based on the comparator output. During the next clock cycle, the adder 302 then subtracts this feedback signal from the analogue input signal received from the pixel in the next clock cycle. The analogue voltage of the feedback signal output from the DAC 310 is dependent on a reference voltage input into the DAC, which in ADC 300 is Vr. For example, if the comparator output is high (logical 1), the DAC may feed back to the adder a signal with voltage Vr and, if the comparator output is low (logical 0), the DAC may feed back to the adder a signal with ground voltage. Whilst the reference voltage Vr/2 input into the comparator 306 is illustrated as being half the reference voltage Vr input into the DAC 310, these reference voltages may not be linked and other reference voltages are envisioned.

At the beginning of each conversion, both the integrator and the digital accumulator may be reset by the Reset control line illustrated in FIG. 3 in order to cope with the high-frequency components associated with the pixel-to-pixel transitions.

As mentioned above, the digital signals output from the comparator, as accumulated in the counter 308, may be mapped to a digital value which is then output from the ADC 300. For example, the digital value may be the sum of the consecutive digital signals. The higher the number of digital signals, the more accurate the digital value. Thus, as a comparator outputs a digital signal at each clock cycle, the accuracy of the digital value output by the ADC 300 is improved with each clock cycle. In an example, for a conversion with four consecutive clock cycles, the possible digital signals may be mapped to digital values as follows:

Consecutive digital signals 0000 may be mapped to digital value '0'.

Consecutive digital signals 1000 or 0100 or 0010 or 0001 may be mapped to digital value '1'

Consecutive digital signals 1100 or 0110 or 0011 may be mapped to digital value '2'.

Consecutive digital signals 1110 or 0111 may be mapped to digital value '3'.

Consecutive digital signal 1111 may be mapped to digital value '4'.

Thus, the number of digital signals having a logical 1 output by the comparator may determine the digital value. In the above example, the four iterations lead to five different digital values, meaning five digital levels can be resolved. The number of digital levels obtained with a number of consecutive comparisons, $n_c$, is $n_c+1$. Accordingly, the equivalent ADC resolution in bits equals $\log 2(n_c+1)$. Digital signals may also be mapped to digital values in other ways.

In order to remove the need for an external CDS amplifier, the sigma delta ADC 300 of FIG. 3 may be adapted to enable integration of CDS. To do this, ADC 300 may be adapted to employ signal inversion using the feedback signal so that the final code at the counter represents the difference between the signal pixel value and reset pixel value. For example, the reset pixel value may be accumulated a number of times and then the signal pixel value may be accumulated the same number of times but with inverted polarity. In such a case, after $n_c$ comparisons of the reset pixel value, the integrator output would be $$v_{o,n_C} = n_C V_{rst} - V_r \Sigma_{i=0}^{n_C} Y_i \tag{1}$$

where $V_{rst}$ is the voltage of the reset pixel value and Yi represents the ith comparator output (logical 1 or 0).

Then, after $n_c$ extra comparisons with the negated voltage of the signal pixel value $V_{sig}$ applied to the input, the integrator output will be $$v_{o,2n_C} = n_C V_{rst} - V_r \Sigma_{i=1}^{n_C} Y_i - n_C V_{sig} + V_r \Sigma_{i=n_C+1}^{2n_C} (1 - Y_i) \tag{2}$$

which can be reorganized as $$v_{o,2n_C} = n_C (V_{rst} - V_{sig}) - V_r \Sigma_{i=1}^{2n_C} Y_i + n_C V_r \tag{3}$$

It can be shown that $V_{o,2n_c}$, is within the interval [0, $V_r$] so that $$(V_{rst} - V_{sig}) - \frac{V_r}{n_C} \left( \sum_{i=1}^{2n_C} Y_i - n_C \right) \le \frac{V_r}{n_C} \tag{4}$$

For a large enough number of comparisons $n_c$, $$\frac{V_r}{n_C}$$

on the right of the equation becomes very small and so the second term on the left of the equation can be seen as a digital representation D of the difference $V_{rst} - V_{sig}$, as shown below.

$$D(V_{rst} - V_{sig}) = n_C - \Sigma_{i=1}^{2n_C} Y_i \tag{5}$$

One possible implementation of an ADC that provides signal inversion as described above to integrate CDS is illustrated in FIG. 4. FIG. 4 provides a circuit diagram of an ADC 400 according to an example. The ADC 400 is an example implementation of a sigma delta ADC, such as ADC 300 of FIG. 3, that further comprises circuitry to apply changes to the feedback signal based on the input signal to perform CDS.

ADC 400 of FIG. 4 may be controlled using the control signals ph0 412, ph1 408, ph2 414, pha 402, phb 428 and phc 430. These control signals may be operated as illustrated in FIG. 5, which provides an example timing diagram of the ADC 400 of FIG. 4, excluding clock waveforms. When ph0 412, ph1 408, ph2 414 and pha 402 are high, also referred to as active, the corresponding switches are closed.

The ADC 400 comprises a Switched Capacitor (SC) integrator comprising an operational transconductance amplifier (OTA) 410 and a capacitor C2 406. The OTA 410 is a voltage controlled current source, i.e. it receives an input voltage and provides an output current, for instance to charge the capacitor C2 406. The corresponding switches are alternately controlled by control signals ph1 408 and ph2 414 respectively, as shown in FIG. 5. When ph1 408 is activated, meaning ph2 414 is not activated, the switch corresponding to ph1 408 is closed and the switch corresponding to ph2 414 is open. The capacitor C1 404 is charged but the capacitor C2 406 is not. When ph2 414 is activated, meaning ph1 408 is not activated, the switch corresponding to ph2 414 is closed and the switch corresponding to ph1 408 is open. The OTA 410, based on the input voltage provided by capacitor C1 404, provides an output current to charge the capacitor C2 406, effectively adding the voltage across capacitor C1 404 to the voltage already present at capacitor C2 406. Thus, as ph1 408 and ph2 414 are alternatively activated during a clock cycle, at every clock cycle, the SC integrator integrates the signal, effectively operating as the integrator 304 of FIG. 3.

During a clock cycle, a clock transitions high and low. The duration of a clock cycle is a time between two transitions of the clock from low to high or two transitions of the clock from high to low. Triggers may be initiated by a particular clock transition, that occurs at each clock cycle and, such triggers may cause switching of switches, or transition of phases, to occur. For example, a transition of a clock from low to high may initiate a trigger and cause ph1 408 to be activated, or phase 1 to start and may also cause ph2 414 to be deactivated, or phase 2 to end. A transition of a clock from low to high may initiate a trigger and cause ph2 414 to be activated, or phase 2 to start. It may also cause ph1 408 to be deactivated or phase 1 to end.

The inverting input to the OTA 410 is connected to capacitor C1 404. The capacitor C1 404 is connected via the switch corresponding to control signal pha 402 to an input to receive a signal from a pixel, via switch 426 to ground and via switch 424 to reference voltage Vr. The signal the capacitor C1 404 receives is based on which switch is closed. The switches 424, 426 are operated to provide a feedback signal to the capacitor C1 404 of either Vr or ground. Control signal phb 428, when activated, causes one of switches 424, 426 to be closed such that capacitor C1 404 samples the feedback signal of Vr or ground. Control signal pha 402, when activated, closes the corresponding switch causing capacitor C1 404 to sample the analogue input signal from the pixel. Control signals pha 402 and phb 428 are activated alternately, as shown in FIG. 5, which causes the alternate accumulation of the analogue input signal and subtraction of the feedback signal of Vr or ground, and so the overall accumulation of the voltage difference, in capacitor C2 406 of the SC integrator, as explained in more detail below. Thus, the switches 424, 426, the switch corresponding to pha 402 and capacitor C1 404 are configured to operate in the same way as adder 302 of FIG. 3.

The SC integrator then outputs the integrated signal to a latched comparator 416, that operates in the same way as comparator 306 of FIG. 3. The comparator 416 may be connected to a counter (not shown) which operates in the same way as counter 308 of FIG. 3. The XOR gate 418 and AND gates 420, 422 operate to control switches 424, 426 connected to Vr and ground respectively to provide a feedback signal to the capacitor C1 404 of either Vr or ground based on the digital output from the comparator 416. Thus, these components operate in the same way as DAC 310 of FIG. 3. ADC 400 may further comprise a clock and clock connections (not shown).

CDS is implemented in the sigma delta modulator of ADC 400 by integrating the signal pixel value and reset pixel value in opposite directions. When CDS is used, the ADC is configured to first receive samples of the reset pixel value, and then receive samples of the signal pixel value. Thus, each column of a pixel array is selected two times within a line interval. During first selection, the reset pixel value is sampled and integrated by the ADC 400 during iterations, without sample and hold being required. During second selection, the photo-diode charge in the pixel is transferred to the sense node and the signal pixel value is integrated by the ADC stage.

ADC 400 is controlled to employ signal inversion to perform the CDS operation as the sigma-delta processing is being carried out. Firstly, the reset pixel value will be accumulated (by the integrator) a number of times, and then the signal pixel value will be accumulated the same number of times, but with inverted polarity so that actual multiple subtraction takes place. Along this process, the accumulated comparator decisions will form a digital representation of the difference. Thus, the final code at the counter represents the subtraction between the two pixel values.

For CDS, in addition to the polarity of the signal being dependent on the signal being input, to keep the appropriate feedback so that the integrator output remains bounded by Vr, whether the magnitude of the voltage is Vr or ground may also depend on the input signal. For example, in ADC 400, during the processing of the reset pixel value, the DAC output is Vr when the comparator is high (logical 1) and ground otherwise. However, while the negated signal pixel value is being converted, the DAC output becomes ground for a high comparator output (logical 1) and –Vr for a low output (logical 0).

The combination of the XOR gate 418 and AND gates 420, 422 provide the differing feedback signals as follows. The XOR gate 418 outputs a signal to AND gate 420 and an inverted signal to AND gate 422. When the reset pixel value is being received by ADC 400, the control signal phc 430 is set low and, when the signal pixel value is being received by ADC 400, the control signal phc 430 is set high, as shown in FIG. 5. The control signal phc 430 effectively controls the XOR gate 418 to propagate the logical signal when the control signal phc 430 is low (logical 0) and to invert the logical signal when the control signal phc 430 is high (logical 1). The control signal phb 428 controls whether a feedback signal is selected or not. If phb 428 is low, no feedback signal is selected. This is because, if phb 428 is low, the outputs to the AND gates 420, 422 are low (logical 0) and so neither switch 424, 426 is closed.

Thus, when the reset pixel value is being received, control signal phc 430 is low so the XOR gate 418 propagates the output from the comparator 416. When the output from the comparator 416 is high (logical 1), the XOR gate output is high (logical 1) and inverted output is low (logical 0). When the control signal phb 428 is high (logical 1), the AND gate 420 output is high (logical 1) which turns the switch 424 on and provides a voltage of Vr to capacitor C1 404. The AND gate 422 output is low meaning switch 426 is open and the ground terminal is disconnected from the circuit.

When the reset pixel value is being received and the output from the comparator 416 is low (logical 0), the XOR gate output is low (logical 0) and inverted output is high (logical 1). When control signal phb 428 is high (logical 1), the AND gate 422 output is high (logical 1) which turns the switch 426 on and provides a ground voltage to capacitor C1 404. The AND gate 420 output is low meaning switch 424 is open and the Vr terminal is disconnected from the circuit.

When the signal pixel value is being received, control signal phc 430 is high so the XOR gate 418 inverts the output from the comparator 416. When the output from the comparator 416 is high (logical 1), the XOR gate output is low (logical 0) and inverted output is high (logical 1). When phb 428 is high (logical 1), the AND gate 422 output is high (logical 1) which turns the switch 426 on and provides a ground voltage to capacitor C1 404. The AND gate 420 output is low meaning switch 424 is open and the Vr terminal is disconnected from the circuit.

When the signal pixel value is being received and the output from the comparator 416 is low (logical 0), the XOR gate output is high (logical 1) and inverted output is low (logical 0). When phb 428 is high (logical 1), the AND gate 420 output is high (logical 1) which turns the switch 424 on and provides a voltage of Vr to capacitor C1 404. The AND gate 422 output is low meaning switch 426 is open and the ground terminal is disconnected from the circuit.

In order for the signal pixel value to be effectively subtracted from the reset pixel value in the ADC 400, the voltage difference during integration of the signal pixel value should be opposite in polarity to the voltage difference during integration of the reset pixel value. This is achieved by the timing of the control signals, as explained below.

As shown in FIG. 5, the conversion time slot is divided into two sub-slots marked by the change in signal phc 430. When phc 430 is low, the reset pixel value will be sampled at the input, and when phc 430 is high, the signal pixel value will be sampled.

At the beginning of the first conversion sub-slot, when ph0 412 and ph1 408 are active simultaneously, the integrator is reset. The OTA 410 is held in unity-gain feedback configuration while capacitors C1 404 and C2 406 are pre-charged at an intermediate voltage called Vcm. At the same time, the reset pixel value is stored in capacitor C1 404. All capacitors also store the OTA offset. This auto-zero technique allows removal of the OTA offset effect. It also attenuates the OTA low-frequency 1/f noise.

Next, ph2 414 and ph1 408 are activated alternately in a non-overlapping sequence during a predetermined number of clock cycles. Control signals pha 402 and phb 428 are also activated alternately in a non-overlapping sequence. The number of clock cycles may be the same for both sub-slots. The OTA 410, capacitors C1 404 and C2 406, switches 426, 424 and switches with corresponding control signals ph1 408, ph2 414, pha 402 and phb 428 perform the operation of a switched capacitor integrator.

In each cycle, in phase 1, when ph1 408 is high, pha 402 is high, ph2 414 is low and phb 428 is low, the reset pixel value is sampled such that charge from the pixel is sampled in capacitor C1 404, resulting in the voltage across capacitor C1 404 being approximately equal to the reset pixel value. In phase 2, when ph2 414 is high, phb 428 is high, ph1 408 is low and pha 402 is low, the charge accumulated in capacitor C1 404 is transferred to capacitor C2 406 and added to the charge already present in capacitor C2 406. Thus, the voltage across C1 404, the voltage of the reset pixel value, is added to capacitor C2 406. For the pixel reset value, phase 1 is the acquisition phase and phase 2 is the charge transfer phase, known as a non-inverting operation, which results in the addition of the reset pixel value voltage to the capacitor C2 406.

Concurrently, in phase 2, the feedback signal is sampled such that charge from the feedback signal is accumulated in capacitor C1 404 resulting in the voltage across capacitor C1 404 being approximately equal to the feedback signal. At the same time, the charge accumulated in capacitor C1 404 is transferred to capacitor C2 406 and added to the charge already accumulated in capacitor C2 406, however, it is the negative of the voltage of the feedback signal that is accumulated in C2 406. For the feedback signal, phase 2 is the charge transfer phase and the acquisition phase, known as an inverting operation, which results in the subtraction of the voltage of the feedback signal from the capacitor C2 406.

In both inverting and non-inverting operation, if the capacitance of capacitor C1 404 does not equal the capacitance of capacitor C2 406, a gain of C1/C2 is applied to the accumulated signal.

At the end of each clock cycle, the comparator is latched by the negated phase of ph2 414 (when ph2 414 is low) and makes a decision, Y, about the sign of the output from the switched capacitor integrator output minus a voltage reference Vr/2. This decision is accumulated to form the output of ADC 400, for example, in a counter (not shown). The decision is also fed back to cause capacitor C1 404 to sample either ground or Vr, as discussed above.

Thus, as mentioned above, in each clock cycle the difference between the feedback signal and the reset pixel value is accumulated in capacitor C2 with a gain equal to C1/C2. Accordingly, after the $n^{th}$ clock cycle, the integrator output becomes $$v_{o,n} = v_{o,n-1} + \frac{C_1}{C_2} V_{rst} - \frac{C_1}{C_2} V_r Y_{n-1} \quad (6)$$

where $v_{o,n-1}$ and $Y_{n-1}$ stand for the integrator and comparator outputs, respectively, at the end of the previous clock cycle, and $V_{rst}$ is the reset pixel value. This operation is repeated a number of times. After completing $n_c$ iterations, the integrator output will be $$v_{o,n_C} = n_C \frac{C_1}{C_2} V_{rst} - \frac{C_1}{C_2} V_r \sum_{i=1}^{n_C} Y_i \quad (7)$$

After the plurality of clock cycles, the second conversion sub-slot begins, which is marked by the transition low-to-high of the signal phc 430. Before starting the sampling, the transfer of charge from the photodiode to the floating diffusion node (or in-pixel charge storage node) should be complete and the signal should be well established at the output of the pixel.

As discussed above, the XOR operation of comparator output with phc 430 being activated yields an inversion of the feedback signal, which results in the voltage Vr being applied to the left of capacitor C1 when the comparator output is low and ground voltage otherwise during phase phb 428. To achieve the change in polarity, for subtraction of the signal pixel value, the timing of the control signals in the second sub-slot differs to the first sub-slot in that the activation of ph1 408 coincides with phb 428 and the activation of ph2 414 coincides with pha 402. This means that the inverting and non-inverting operations of the SC integrator are switched such that, for the pixel reset value, the switched capacitor integrator is in inverting operation, which results in the subtraction of the voltage of the pixel reset value and, for the feedback signal, the switched capacitor integrator is in non-inverting operation, which results in the addition of the feedback signal voltage. Thus, the difference between the feedback signal and signal pixel value is effectively subtracted from C2 406 with a gain equal to C1/C2, which is opposite to the first sub-slot. After $n_c$ iterations within the second sub-slot, the integrator output will be $$v_{o,2n_C} = n_C \frac{C_1}{C_2} (V_{rst} - V_{sig}) - \frac{C_1}{C_2} V_r \sum_{i=1}^{n_C} Y_i - \frac{C_1}{C_2} V_r \sum_{i=n_C+1}^{2n_C} (1 - Y_i) \quad (8)$$

-continued $$v_{o,2n_C} = n_C \frac{C_1}{C_2} (V_{rst} - V_{sig}) - \frac{C_1}{C_2} V_r \sum_{i=1}^{2n_C} Y_i + n_C \frac{C_1}{C_2} V_r \quad (9)$$

This is the same as equation (3) with the exception of the factor C1/C2. It can be shown though that this factor is unimportant because the comparator only reacts to the sign of the difference between the integrator output and Vr/2. Hence the relationship in equation (5) applies and the ADC 400 of FIG. 4 efficiently implements an ADC with integrated CDS.

As the ADC 400 uses oversampling, pixel noise contributions are reduced. Moreover, the thermal noise coming from the pixel is reduced by the integrated CDS, whereas the flicker noise is attenuated.

In low noise devices, a high conversion gain is required. The conversion gain is the relation between the voltage in the floating diffusion node (node A) and the collected electrons. The conversion gain is inversely related to the capacitance in the floating diffusion node, $C_A$, $CG=q/C_A$, where q stands for the electron charge value q=1.6e-19. All the noise preceding the pixel, like ADC noise, is divided by the conversion gain when obtaining the electrons. Thus, the higher the conversion gain, the lower noise is delivered by the image sensor. However, increasing the conversion gain has a drawback of reducing the maximum number of electrons that can be collected in the pixel, which is known as full well capacity (FWC), since the maximum voltage swing is limited either by the in-pixel voltage or the input range of the ADC. The higher the conversion gain, the lower FWC is obtained in the image sensor. It is a trade-off when using the typical pixel architecture, for example the pixel architecture illustrated in FIG. 2.

In order to overcome this limitation, a pixel architecture with dual conversion gain can be used, as illustrated in FIG. 6. Dual conversion gain is used to extend the maximum number of electrons that the image sensor is able to collect and digitalize and at the same time maintain low noise performance.

FIG. 6 provides a circuit diagram of a dual conversion gain pixel 600. Whilst a particular architecture for dual conversion gain pixel is illustrated in FIG. 6, others are envisioned. Dual conversion gain pixel 600 is an adapted version of pixel 200 of FIG. 2, which has been explained in detail above. Thus, pixel 600 also comprises the four transistors having control signals labelled as transfer gate (TX) 208, reset (RST) 206 and row select (SEL) 210 and a transistor labelled as source follower (SF) 202, as described in FIG. 2. Pixel 600 further comprises a transistor having a control signal labelled as high dynamic range (HDR) 602.

In this architecture, two conversions are performed. The first conversion, which occurs when HDR is low, is performed by integrating the charge only in node A, known as high gain operation (HG). The second conversion, which occurs when HDR is high, is performed by integrating the signal in the node A and node B with much lower conversion gain, known as low gain operation (LG).

FIG. 7 provides an example timing diagram of the pixel 600 of FIG. 6 and shows the waveforms used in the dual conversion gain operation. Firstly, when the RST goes down whilst HDR remains up, the reset pixel value for low gain (RST_LG) is sampled. Secondly, when HDR goes down, the reset pixel value for high gain is sampled (RST_HG). Before the signal pixel value can be taken, the charge from the photodiode needs to be transferred in a first transfer to the floating diffusion node with high conversion gain, as illustrated in the bottom line of FIG. 7. Once this is complete, high gain signal pixel value is sampled (SIG_HG). Next, the signal HDR goes up, the voltage in the floating diffusion node also goes up, and the second transfer can extract any remaining electrons in the photodiode (if any). Finally, the low gain signal pixel value is sampled (SIG_LG).

Once CDS is performed, two values will have been obtained: a high gain value and a low gain value. One of these values can then be selected as the final value. When the amount of electrons is small, the photodiode is empty with the first transfer and the SIG_LG value remains close to RST_LG and is non-useful. In this case, the valid converted value is the high gain value, which can be selected as the final value. When the amount of electrons is big, after the first transfer, the voltage in floating diffusion saturates and there is still charge in the FD to be totally transferred to the FD. The second transfer moves all the charges to the floating diffusion node with low conversion gain configuration. In this case, the high gain value is not useful, and it is the low gain value that is useful and can be selected as the final value.

As mentioned above, the lower the conversion gain, the higher the noise. Thus, for the low gain signal, the noise associated with the photon signal, the shot noise, is much larger than the for the high gain signal and so low noise conversion is not required. The shot noise is equal to the square root of the photon signal. The noise intrinsic to the signal for low gain will be equal to the square root of the signal value in the inflexion point of changing from high gain to low gain.

In order to provide a high dynamic range, it is advantageous for the ADC to be operable with dual conversion gain pixel 600. In order for an ADC incorporating CDS, such as ADC 400 of FIG. 4, to be operable with a dual conversion gain pixel, the ADC needs to be operable to sequentially receive a reset pixel value when the pixel is in low gain, a reset pixel value when the pixel is in high gain, a signal pixel value when the pixel is in high gain and a signal pixel value when the pixel is in low gain, as shown in timing diagram 700 of FIG. 7. FIG. 8 provides a schematic diagram of an ADC 810 according to an example. ADC 800 is operable with dual conversion gain pixel 600.

ADC 800 is for converting the analogue output of a dual conversion gain pixel 802 of an image sensor. The dual conversion gain pixel 802 is operable to sequentially output a reset pixel value and a signal pixel value sequentially with both a first gain and a second gain different to the first gain. The first gain may be the low gain and the second gain may be the high gain. The ADC 800 comprises analogue storage 806 for storing the reset pixel value output with the first gain. The ADC 800 further comprises a converter stage 808 arranged to sequentially receive a first analogue input indicative of a reset pixel value of the dual conversion gain pixel 802 and a second analogue input indicative of a signal pixel value of the dual conversion gain pixel 802. The converter stage 808 is configured to sequentially sample the first input and the second input and output a digital value indicative of a difference between the first input and the second input. The ADC 800 further comprises circuitry 804 configured to sequentially provide the reset pixel value output with the second gain as a first input to the converter stage 808 and the signal pixel value output with the second gain as a second input to the converter stage 808 such that the converter stage 808 sequentially samples the first and second inputs and outputs a first digital value indicative of a difference between the reset pixel value output with the second gain and the signal pixel value output with the second gain. The circuitry 804 is further configured to provide the reset pixel value output with the first gain and stored in the analogue storage 806 as a first input to the converter stage 808 and the signal pixel value output with the first gain as a second input to the converter stage 808. The converter stage 808 is configured to sample the first and second inputs and output a differential signal indicative of a difference between the reset pixel value output with the first gain and the signal pixel value output with the first gain.

ADC 800 can perform CDS using the converter stage 808 which is configured to sequentially sample the first input and the second input and output a digital value indicative of a difference between the first input and the second input. Moreover ADC 800 can perform DCG by receiving inputs from the pixel in the specified sequence and storing the low gain reset pixel value in analogue storage 806 for use with the low gain signal pixel value after the difference between the high gain signal and reset pixel values has been found. The ADC 800 having an integrated CDS combined with operability with DCG pixels provides a readout element 110 with reduced noise and increased dynamic range whilst maintaining the high speed. The invention therefore achieves an optimum point between speed, noise and full well capacity.

FIG. 9 provides a circuit diagram of an ADC 900 according to an example. ADC 900 is an example of an ADC 800 is described above with reference to FIG. 8, provides integrated CDS and is operable with a dual conversion gain pixel. ADC 900 comprises many of the same components as ADC 400 of FIG. 4. No detailed description of the same component is therefore provided with reference to FIG. 8. During high gain operation, whilst sequentially receiving the high gain reset pixel value and the high gain signal pixel value, the ADC 900 may perform conversion as described above with reference to FIGS. 4 and 5.

ADC 900 further comprises an extra branch between the pixel input and the inverting input of the OTA 410 comprising a switch connected to control signal pha_LG 902 and a capacitor C1_LG 904. The capacitor C1_LG 904 is also connected to ground via switch 906. Whilst the pixel input can be connected to the inverting input of the OTA via C1 when pha 402 is active causing the corresponding switch to be closed, the pixel input can also be connected to the inverting input of the OTA via C1_LG when pha_LG is active causing the corresponding switch to be closed. The function of the capacitor C1_LG 904 and additional switches are as follows.

During dual conversion gain operation, as described in relation to FIGS. 6 and 7, the pixel sequentially outputs a reset pixel value when the pixel is in low gain, a reset pixel value when the pixel is in high gain, a signal pixel value when the pixel is in high gain and a signal pixel value when the pixel is in low gain. When the reset pixel value with low gain is output by the pixel, control signal pha_LG 902 is high causing the corresponding switch to be closed, control signal pha 402 is high causing the corresponding switch to be open and switch 906 is also open so the reset pixel value with low gain is sampled in capacitor C1_LG 904 of ADC 900.

Next, the control signal pha_LG 902 transitions low causing the corresponding switch to be open such that the subsequent pixel outputs do not affect the storage of the reset pixel value with low gain in capacitor C1_LG 904. The high gain conversion starts and the ADC 900 performs internal CDS as explained in relation to FIGS. 4 and 5. For high gain conversion, ADC 900 may sample the reset pixel value and, subsequently, the signal pixel value over multiple clock cycles. At the end of the high gain conversion the capacitor C2 406 is reinitialized before doing any other operation. After that, the low gain reset pixel value, previously sampled at the beginning, is transferred from capacitor C1_LG 904 to capacitor C2 406 using the SC integrator as described above while at the same time the signal pixel value with low gain is sampled. For low gain conversion, ADC 900 may sample the reset pixel value and the signal pixel value over one clock cycle.

In detail, in phase 2, as explained in relation to FIGS. 4 and 5, ph2 414 is high, phb 428 is high, ph1 408 is low and pha 402 is low. The switch 906 is also closed. The charge accumulated in capacitor C1_LG 904, indicative of the low gain reset pixel value, is transferred to capacitor C2 406, which results in the addition of the reset pixel value voltage to the capacitor C2 406. Concurrently, in phase 2, the low gain signal pixel value is sampled such that charge from the low gain signal pixel value is accumulated in capacitor C1_LG 904, resulting in the voltage across capacitor C1_LG 904 being approximately equal to the low gain signal pixel value. At the same time, the charge accumulated in capacitor C1_LG 904 is transferred to capacitor C2 406 and added to the charge already accumulated in capacitor C2 406, however, it is the negative of the voltage of the low gain signal pixel value that is accumulated in C2 406. This is because, when the low gain reset pixel value is transferred to the capacitor C2 406, the low gain pixel value is sampled such that what is actually transferred to the capacitor C2 406 is the difference between the low gain reset pixel value and the low gain signal pixel value. As mentioned previously, if the capacitance of capacitor C1_LG 904 does not equal the capacitance of capacitor C2 406, a gain of C1_LG/C2 is applied to the accumulated signal. As the low gain conversion is performed over one clock cycle, the converter stage may only output the accumulated signal, the differential signal, at the integrator. There may be no output from the comparator for low gain. Thus, for the first gain, at the output of the first stage ADC the result of the CDS operation for the low gain value is the differential signal $V_{LG}$ where $$V_{LG} = \frac{C_{1\_LG}}{C_2}(V_{RST\_LG} - V_{SIG\_LG}) \qquad (10)$$

The differential signal may then be converted to a digital value by an optional second converter stage provided in the ADC (no shown) to provide a low gain digital value. The low gain digital value and high gain digital value may then be compared and one of the values may be selected as the output of the ADC 900. As discussed above, when the amount of electrons is small, the useful converted value is the high gain value. When the amount of electrons is large, the high gain value is not useful, and it is the low gain value that is used. This enables a larger range of electrons to be detected by the ADC, extending the dynamic range of the image sensor whilst maintain low noise.

As mentioned above, unlike during high gain conversion, during low gain conversion, the signal pixel value and reset pixel value may only be sampled once, giving an OSR of 1. This is to optimize timing at the cost of higher noise for the low gain ADC conversion. However, the noise is always typically much lower than the shot noise and so there may be little to no penalty in the noise of the final signal of using a OSR of 1 for the low gain conversion.

Alternatively, ADC 900 may sample the reset pixel value and the signal pixel value of the low gain over more than one clock cycle and the comparator may output a digital signal based on the low gain reset pixel value and signal pixel value. For example, the comparator may output one bit for low gain.

FIG. 10 provides an example flowchart of a method 1000 of an analogue to digital converter for converting the analogue output of a dual conversion gain pixel of an image sensor. Method 1000 may be performed by ADC 800 of FIG. 8 or ADC 900 of FIG. 9. As mentioned above, the dual conversion gain pixel 600 is operable to sequentially output a reset pixel value and a signal pixel value sequentially with both a first gain and a second gain different to the first gain. The method 1000 comprises storing 1002, in analogue storage 806, the reset pixel value output with the first gain. The method 1000 further comprises sequentially receiving 1004, at a converter stage 808, the reset pixel value output with the second gain as a first analogue input and the signal pixel value output with the second gain as a second analogue input. The method 1000 further comprises sequentially sampling 1006, at the converter stage 808, the first and second inputs and outputting a first digital value indicative of a difference between the reset pixel value output with the second gain and the signal pixel value output with the second gain. The method 1000 further comprises receiving 1008, at the converter stage 808, the reset pixel value output with the first gain and stored in the analogue storage 806 as a first input and the signal pixel value output with the first gain as a second input. The method 1000 further comprises sampling 1010, at the converter stage 808, the first and second inputs and outputting a differential signal indicative of a difference between the reset pixel value output with the first gain and the signal pixel value output with the first gain. The method may further comprise any steps mentioned above in relation to ADC 400 of FIG. 4, ADC 800 of FIG. 8 or ADC 900 of FIG. 9. In particular the method may further comprise, receiving, at a second converter stage, the differential signal and outputting, based on the differential signal, a first gain digital value indicative of a difference between the reset pixel value output with the first gain and the signal pixel value output with the first gain.

FIG. 11 provides a schematic diagram of an image sensor 1100 according to an example. The image sensor 1100 comprises a pixel array 1102 comprising an array of dual conversion gain pixels 600 and an ADC 1110. The ADC 1110 may have any of the features described above in connection with the ADC 800 of FIG. 8 and/or the ADC 900 of FIG. 9. FIG. 12 provides a schematic diagram of an image sensor 1200 according to an example. Image sensor 1200 is an example of image sensor 1100 of FIG. 11. Image sensor 1200 also comprises an array of dual conversion gain pixels 600. Moreover, image sensor 1200 includes an ADC 1210 per column of the array of pixels 600.

FIG. 13 provides a schematic diagram of a system 1300 for sensing an image according to an example. The system 1300 comprises an image sensor 1304, which may include any of the features of the image sensor 1100 of FIG. 11 and/or image sensor 1200 of FIG. 12, and a controller 1302. The controller 1302 is configured to select one or more pixels 600 of the image sensor 1304 to be sensed. The controller 1302 is further configured to control the operation of the one or more pixels 600 to sequentially output a reset pixel value and a signal pixel value sequentially with both the first gain and the second gain different to the first gain. The controller 1302 is further configured to control the circuitry of the at least one converter of the image sensor based on the operation of the one or more pixels 600 to convert the analogue output of each of the one or more pixels 600 to a digital value.

In some embodiments, an ADC based on the sigma delta topology, for example ADC 400 of FIG. 4, ADC 800 of FIG. 8 or ADC 900 of FIG. 9, may be the first stage of a two stage ADC. For example, in order to reduce the time taken to reach an accurate digital value given the need for performing CDS and DCG and to overcome the limit of speed in pure integrating sigma-delta based ADCs, the ADC may comprise a second converter stage such that the first stage and second stage of the ADC work can work in a pipelined manner. Thus, ADC 800 of FIG. 8 may further comprise a second converter stage (not shown). ADC 900 may be connected to a second converter stage by the output of the OTA 410. An example of a two stage ADC is illustrated in FIG. 14.

FIG. 14 provides a schematic diagram of an image sensor 1400 according to an example. The image sensor 1400 comprises ADC 1404, which may also be used in any other image sensor. Image sensor 1400 further comprises a pixel array where a pixel 1406 is selected and outputs a signal via a data column line, as described in relation to FIG. 1. The signal is then fed through an analogue buffer 1408 and into the ADC 1404. The analogue buffer 1408 is used to isolate the ADC load from the column load and keep the pixel only driving the pixel column load. Image sensor 1400 does not require a sample and hold block. The image sensor 1400 may also comprise other components connected to the pixel array and/or ADC 1404 such as a programmable current source and a programmable offset.

ADC 1404 is a two-stage ADC with direct conversion, integrated CDS and dual conversion gain. ADC 1404 comprises a first stage ADC 1410 which is based on the first order sigma delta topology and performs integrated CDS and is operable with a dual conversion gain pixel. First stage ADC 1410 may include any of the features described above in connection with ADC 400 of FIG. 4, ADC 800 of FIG. 8 and/or ADC 900 of FIG. 9. The operation of first stage ADC has been explained in relation to these Figures and so will not be described again in detail with reference to FIG. 14. The outputs from the comparator or, optionally, counter of the first stage ADC 1410 provides a number of bits N.

ADC 1404 further comprises a second stage ADC 1412. The second stage ADC 1412 is connected to the pixel via the first stage ADC 1410. For the high gain, the final analogue voltage value after the sigma-delta operation in the first stage ADC 1410 is known as residue. The residue is sampled and converted by the second stage ADC 1412. At the end of the high gain conversion, after the first stage ADC 1410 has performed conversion of the high gain reset and signal pixel values over the plurality of clock cycles, and produced a digital value, the residue remaining in the integrator is sampled and converted by the second stage ADC 1412, which generates its own digital value.

The digital output word, also known as the second gain digital value, is the combination of the two digital values coming from the two ADC stages, where the digital value from the first stage ADC, the first digital value, outputs the most significant bits and the digital value from the second stage ADC, the second digital value, outputs the least significant bits. The output of the first stage ADC 1410 is scaled by the number of bits of the second stage $N_2$ powered by 2, as shown by the following equation where $D_{out}$ is the digital output word, $D_1$ is the digital value output by the first stage ADC 1410 and $D_2$ is the digital value output by the second stage ADC 1412.

$$D_{out}=D_1 \cdot 2^{N_2}+D_2 \qquad (11)$$

For the low gain, the analogue voltage value output from the first stage ADC 1410 is known as the differential signal. The differential signal is sampled and converted by the second stage ADC 1412. At the end of the low gain conversion, after the first stage ADC 1410 has performed conversion of the low gain reset and signal pixel values to produce the differential signal, the differential signal output by the integrator is sampled and converted by the second stage ADC 1412, which generates the first gain digital value. For the first gain, there may be no digital value output by the first stage and so the first gain digital value is formed from the number of bits output by the second stage ADC 1412.

FIG. 15 provides an example timing diagram of the image sensor 1400 of FIG. 14.

The presented architecture optimizes the conversion time because it is able to operate in overlap mode, as shown in FIG. 15. The first stage ADC 1410 performs CDS conversion (signal and reset pixel value integration) whilst the pixel is outputting the reset and signal pixel values. After conversion by the first stage ADC 1410, the analogue residue from the first stage ADC 1410 is sampled by the second stage ADC 1412 and eventually converted into the digital domain. The conversion of the residue data in the second stage ADC 1412 is performed whilst the first stage ADC 1410 performs CDS conversion of the next pixel values. This parallel operation allows the conversion time to be reduced. Moreover, the noise in the second stage ADC 1412 is also reduced by the OSR of the first stage ADC 1410 because the input signal of the second stage ADC 1412 is amplified by the OSR factor in the first stage ADC 1410.

In an array of pixels, each pixel in a row may be read out simultaneously by a corresponding ADC 1404, as an ADC 1404 may be connected to each column of the array of pixels. Thus, the row time indicated is the time taken for each of the pixels in a row to be sampled twice by a first stage ADC 1410. The row time also indicates the total conversion delay caused by that row of pixel as, although a second stage ADC converts the residue after the row time, this conversion is performed in parallel with conversion by the first stage ADC of a pixel in the next row of pixels.

The select line SEL is activated to enable a pixel or a row of pixels if the row is to be read out simultaneously. The reset line RST is to reset the pixel and/or the first stage ADC 1410 and/or the second stage ADC 1412. The TRF line is to transfer the charge collected by the photodiode of the pixel to the readout node in order to obtain the signal pixel value.

The second stage ADC 1412 may be a single slope ADC, an example of which is shown in FIG. 16. Thus, the ADC 1404 of FIG. 14 may comprise a first-order sigma delta modulator that generates the most significant bits followed by a single slope ADC, also known as a ramp converter, that generates the least significant bits.

FIG. 16 provides a schematic diagram of a single slope ADC 1600. The second stage ADC 1412 of FIG. 14 may comprise ADC 1600 or may be based on ADC 1600. ADC 1600 comprises an analogue ramp 1602 which generates an analogue ramp reference. The analogue ramp reference is a voltage reference that linearly increases with time. ADC 1600 further comprises a comparator 1606 for comparing the analogue signal sampled by the ADC 1600, for example the residue of the previous converter stage, with the analogue ramp reference. ADC 1600 further comprises a digital counter 1604, also known as a digital ramp, which increases in discrete time intervals over time. ADC 1600 further comprises a digital register 1608 for storing a digital value provided by digital counter 1604.

During conversion, the analogue signal is sampled and the comparator 1606 compares this signal to an analogue ramp reference generated by analogue ramp 1602. A digital counter 1604 is also started. When the analogue ramp reference 1602 crosses the analogue input level, the comparator 1606 toggles, and the digital count of the counter 1604 is sampled in the digital register 1608, the digital count corresponding to the time period in which the analogue ramp reference crosses the input signal. When the comparator 1606 toggles, it may provide an "enable" signal to the register 1608 so that the register obtains the digital count of the counter 1604. The higher the analogue signal, the longer it will take for the analogue ramp reference to exceed the input signal and so the higher the digital count. Thus, the digital count is representative of the analogue input signal and is output by the ADC 1600 as the digital value Ramp ADCs are advantageous for image sensors having an ADC per column because they require a small amount of circuitry, so provide a more compact image sensor, and are also compatible with a very low pixel pitch. Moreover, a single analogue ramp signal and a single digital ramp signal can be applied to all ramp ADCs in the image sensor such that the only circuitry needed per column is a comparator and a register.

Whilst ramp ADCs are normally slow, due to the inclusion of the ramp ADC as a second stage ADC in a pipeline architecture, the speed of the two stage ADC can be maintained.

The circuits described above may include more components than shown and the feedback loops within the circuits may also include more components than shown. For example, clock circuitry and power circuitry connected to the components of the ADCs and image sensors are not shown but may be included.

As an example, an analogue to digital converter for converting the analogue output of a dual conversion gain pixel of an image sensor is disclosed as described for one or more embodiments. The dual conversion gain pixel is operable to sequentially output a reset pixel value and a signal pixel value sequentially with both a first gain and a second gain different to the first gain. The analogue to digital converter comprises analogue storage for storing the reset pixel value output with the first gain. The analogue to digital converter further comprises a converter stage arranged to sequentially sample a first analogue input indicative of a reset pixel value of the dual conversion gain pixel and a second analogue input indicative of a signal pixel value of the dual conversion gain pixel. The converter stage is configured to sequentially sample the first input and the second input and output a digital value indicative of a difference between the first input and the second input. The analogue to digital converter further comprises circuitry configured to sequentially provide the reset pixel value output with the second gain as a first input to the converter stage and the signal pixel value output with the second gain as a second input to the converter stage such that the converter stage sequentially samples the first and second inputs and outputs a first digital value indicative of a difference between the reset pixel value output with the second gain and the signal pixel value output with the second gain. The circuitry is further configured to provide the reset pixel value output with the first gain and stored in the analogue storage as a first input to the converter stage and the signal pixel value output with the first gain as a second input to the converter stage wherein the converter stage is configured to sample the first and second inputs and output a differential signal indicative of a difference between the reset pixel value output with the first gain and the signal pixel value output with the first gain. An image sensor comprising the analogue to digital converter, a system comprising the image sensor and a method are also described herein in accordance with one or more embodiments.

A circuit or system described above may be implemented on a chip, a computer, a tablet, a mobile phone or any other such device. Moreover, a description of a circuit or system described above may be provided on a computer readable medium. Such a computer readable medium may then be used, for example, to instruct a machine to produce the circuit or system.

It will be appreciated that embodiments of the present invention can be realised in the form of hardware, software or a combination of hardware and software. Any such software may be stored in the form of volatile or non-volatile storage such as, for example, a storage device like a ROM, whether erasable or rewritable or not, or in the form of memory such as, for example, RAM, memory chips, device or integrated circuits or on an optically or magnetically readable medium such as, for example, a CD, DVD, magnetic disk or magnetic tape. It will be appreciated that the storage devices and storage media are embodiments of machine-readable storage that are suitable for storing a program or programs that, when executed, implement embodiments of the present invention. Accordingly, embodiments provide a program comprising code for implementing a system or method as claimed in any preceding claim and a machine-readable storage storing such a program. Still further, embodiments of the present invention may be conveyed electronically via any medium such as a communication signal carried over a wired or wireless connection and embodiments suitably encompass the same.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed. The claims should not be construed to cover merely the foregoing embodiments, but also any embodiments which fall within the scope of the claims.

The invention claimed is:

1. An analogue to digital converter for converting an analogue output of a dual conversion gain pixel of an image sensor, wherein the dual conversion gain pixel is operable to sequentially output a reset pixel value and a signal pixel value sequentially with both a first gain and a second gain different to the first gain, wherein the analogue to digital converter comprises:

analogue storage for storing the reset pixel value output with the first gain;
a first converter stage arranged to sequentially sample a first analogue input indicative of a reset pixel value of the dual conversion gain pixel and a second analogue input indicative of a signal pixel value of the dual conversion gain pixel, wherein the first converter stage is configured to sequentially sample the first analogue input and the second analogue input and output a digital value indicative of a difference between the first input and the second input; and
circuitry configured to sequentially provide the reset pixel value output with the second gain as a first input to the first converter stage and the signal pixel value output with the second gain as a second input to the first converter stage over a plurality of clock cycles of the first converter stage such that the first converter stage sequentially samples the first and second inputs and outputs a first digital value indicative of a difference between the reset pixel value output with the second gain and the signal pixel value output with the second gain, and
wherein the circuitry is further configured to provide the reset pixel value output with the first gain and stored in the analogue storage as a third input to the first converter stage and the signal pixel value output with the first gain as a fourth input to the first converter stage over one clock cycle of the first converter stage and wherein the first converter stage is configured to sample the third and fourth inputs and output a differential signal indicative of a difference between the reset pixel value output with the first gain and the signal pixel value output with the first gain; and
a second converter stage,
wherein the circuitry is further configured to provide the differential signal to the second converter stage and wherein the second converter stage is configured to sample the differential signal and output a first gain digital value indicative of the difference between the reset pixel value output with the first gain and the signal pixel value output with the first gain.

2. An analogue to digital converter according to claim 1, wherein the second gain is greater than the first gain.

3. An analogue to digital converter according to claim 1, wherein the circuitry and converter stage are configured such that the first converter stage performs embedded analogue correlated double sampling for the reset pixel value and the signal pixel value output with the second gain.

4. An analogue to digital converter according to claim 1, wherein the first converter stage comprises:
an integrator for integrating a voltage difference between an analogue input sampled by the first converter stage and a feedback signal; and
a comparator for comparing the integrated voltage difference to a reference voltage, wherein the feedback signal is dependent on an output of the comparator.

5. An analogue to digital converter according to claim 4, wherein the polarity of the feedback signal is dependent on whether the analogue input sampled by the first converter stage is the first input or the second input such that the digital value output by the first converter stage is indicative of the difference between the first input and the second input.

6. An analogue to digital converter according to claim 4, wherein the circuitry is configured to provide the first input to the first converter stage over a plurality of clock cycles of the first converter stage such that the firstconverter stage samples the first input a plurality of times to provide a plurality of outputs at the comparator for the first input, and
wherein the circuitry is configured to provide the second input to the first converter stage over a plurality of clock cycles of the first converter stage such that the first converter stage samples the second input a plurality of times to provide a plurality of outputs at the comparator for the second input.

7. An analogue to digital converter according to claim 1, wherein the second converter stage is configured to output the first gain digital value based on the comparison of the differential signal to a variable reference voltage.

8. An analogue to digital converter according to claim 1, wherein the circuitry is further configured to provide an analogue residue to the second converter stage after sequentially providing the first input to the first converter stage and the second input to the first converter stage, and
wherein the second converter stage is configured to sample the analogue residue and output a second digital value indicative of the analogue residue.

9. An analogue to digital converter according to claim 8, wherein the second converter stage is configured to output the second digital value based on comparison of the sampled analogue residue to a variable reference voltage.

10. An analogue to digital converter according to claim 8, wherein the analogue to digital converter is configured to determine a second gain digital value indicative of the difference between the reset pixel value output with the second gain and the signal pixel value output with the second gain, wherein the second gain digital value is dependent on the first and second digital values.

11. An analogue to digital converter according to claim 10, wherein the circuitry is further configured to select one of the first gain digital value and the second gain digital value to output from the converter.

12. An image sensor comprising an array of dual conversion gain pixels and at least one analogue to digital converter, each of the at least one analogue to digital converter being an analogue to digital converter according to claim 1.

13. A system for sensing an image, the system comprising an image sensor according to claim 12 and a controller configured to:
select one or more dual conversion gain pixels of the image sensor to be sensed;
control the operation of the one or more dual conversion gain pixels to sequentially output a reset pixel value and a signal pixel value sequentially with both the first gain and the second gain different than the first gain; and
control the circuitry of the at least one converter of the image sensor based on the operation of the one or more dual conversion gain pixels to convert the analogue output of each of the one or more dual conversion gain pixels to a digital value.

14. A method of an analogue to digital converter for converting an analogue output of a dual conversion gain pixel of an image sensor, wherein the dual conversion gain pixel is operable to sequentially output a reset pixel value and a signal pixel value sequentially with both a first gain and a second gain different than the first gain, the method comprising:
storing, in analogue storage, the reset pixel value output with the first gain;
sequentially receiving, at a first converter stage, the reset pixel value output with the second gain as a first analogue input and the signal pixel value output with the second gain as a second analogue input;

sequentially sampling, at the first converter stage, the first and second analogue inputs over a plurality of clock cycles of the first converter stage and outputting a first digital value indicative of a difference between the reset pixel value output with the second gain and the signal pixel value output with the second gain;

receiving, at the first converter stage, the reset pixel value output with the first gain and stored in the analogue storage as a third analogue input and the signal pixel value output with the first gain as a further analogue input over one clock cycle of the first converter stage;

sampling, at the first converter stage, the third and fourth analogue inputs and outputting a differential signal indicative of a difference between the reset pixel value output with the first gain and the signal pixel value output with the first gain; and sampling at a second converter stage the differential signal and outputting from the second converter stage a first gain digital value indicative of the difference between the reset pixel value output with the first gain and the signal pixel value output with the first gain.

* * * * *